United States Patent
Yamazaki et al.

(10) Patent No.: US 12,527,167 B2
(45) Date of Patent: Jan. 13, 2026

(54) DISPLAY DEVICE

(71) Applicant: SEMICONDUCTOR ENERGY LABORATORY CO., LTD., Atsugi (JP)

(72) Inventors: Shunpei Yamazaki, Tokyo (JP);
Takayuki Ikeda, Kanagawa (JP);
Kenichi Okazaki, Kanagawa (JP);
Yasumasa Yamane, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 270 days.

(21) Appl. No.: 18/271,541

(22) PCT Filed: Jan. 17, 2022

(86) PCT No.: PCT/IB2022/050335
§ 371 (c)(1),
(2) Date: Jul. 10, 2023

(87) PCT Pub. No.: WO2022/162491
PCT Pub. Date: Aug. 4, 2022

(65) Prior Publication Data
US 2024/0057404 A1    Feb. 15, 2024

(30) Foreign Application Priority Data

Jan. 28, 2021  (JP) .................................. 2021-011703
Jan. 29, 2021  (JP) .................................. 2021-012768
Feb. 2, 2021   (JP) .................................. 2021-015236

(51) Int. Cl.
*H10K 59/122*    (2023.01)
*H10K 50/13*     (2023.01)
(Continued)

(52) U.S. Cl.
CPC ........... *H10K 59/122* (2023.02); *H10K 50/13* (2023.02); *H10K 50/19* (2023.02); *H10K 59/124* (2023.02);
(Continued)

(58) Field of Classification Search
CPC ............... H10K 59/122; H10K 59/353; H10K 59/80521; H10K 59/873; H10K 59/124;
(Continued)

(56) References Cited

U.S. PATENT DOCUMENTS 5,953,985 A    9/1999  Kobayashi
6,120,338 A    9/2000  Hirano. et al.
(Continued)

FOREIGN PATENT DOCUMENTS

CN    108899349 A    11/2018
CN    111033602 A    4/2020
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Anne M Hines
(74) *Attorney, Agent, or Firm* — NIXON PEABODY LLP; Jeffrey L. Costellia

(57) ABSTRACT

A high-resolution display device is provided. A display device with both high display quality and high resolution is provided. The display device includes a first light-emitting element and a second light-emitting element. The first light-emitting element includes a first pixel electrode, a first EL layer, and a common electrode. The second light-emitting element includes a second pixel electrode, a second EL layer, and the common electrode. An insulating layer is
(Continued)

included between the first pixel electrode and the second pixel electrode. The insulating layer includes a first region overlapping with the first EL layer, a second region overlapping with the second EL layer, and a third region positioned between the first region and the second region. A side surface of the first EL layer and a side surface of the second EL layer are positioned over the insulating layer and are provided to face each other. The common electrode is provided along the side surface of the first EL layer, the side surface of the second EL layer, and a top surface of the insulating layer. A width of the insulating layer is greater than or equal to 2 times and less than or equal to 4 times that of a distance between the first pixel electrode and the second pixel electrode.

12 Claims, 23 Drawing Sheets

(51) Int. Cl.
H10K 50/19 (2023.01)
H10K 59/124 (2023.01)
H10K 59/35 (2023.01)
H10K 59/80 (2023.01)

(52) U.S. Cl.
CPC ..... *H10K 59/353* (2023.02); *H10K 59/80521* (2023.02); *H10K 59/873* (2023.02); H10K 59/805 (2023.02); H10K 59/8792 (2023.02)

(58) Field of Classification Search
CPC .. H10K 59/805; H10K 59/8792; H10K 50/13; H10K 50/19
See application file for complete search history.

(56) References Cited

U.S. PATENT DOCUMENTS

| | | | |
|---|---|---|---|
| 8,878,198 | B2 | 11/2014 | Choi et al. |
| 9,997,741 | B2 | 6/2018 | Choi et al. |
| 11,302,898 | B2 | 4/2022 | Nakamura et al. |
| 11,387,298 | B2 | 7/2022 | Hou |
| 2002/0072139 | A1 | 6/2002 | Kashiwabara |
| 2002/0113546 | A1 | 8/2002 | Seo et al. |
| 2009/0219473 | A1* | 9/2009 | Fujioka ............ G02F 1/133371 349/114 |
| 2010/0301326 | A1* | 12/2010 | Miyairi ................ H10D 30/673 257/43 |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0064858 | A1 | 3/2015 | Choi et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0256754 | A1 | 9/2017 | Defranco et al. |
| 2018/0190908 | A1 | 7/2018 | Ke et al. |
| 2020/0203662 | A1 | 6/2020 | Mollard et al. |
| 2021/0005669 | A1 | 1/2021 | Kamada et al. |
| 2021/0159461 | A1 | 5/2021 | Nakamura et al. |
| 2022/0216449 | A1 | 7/2022 | Nakamura et al. |
| 2025/0133903 | A1* | 4/2025 | Hodo .................... H05B 33/10 |

FOREIGN PATENT DOCUMENTS

| | | |
|---|---|---|
| CN | 210926019 U | 7/2020 |
| CN | 112186111 A | 1/2021 |
| JP | 2000-036385 A | 2/2000 |
| JP | 2002-324673 A | 11/2002 |
| JP | 2003-059663 A | 2/2003 |
| JP | 2008-098106 A | 4/2008 |
| JP | 2008-147072 A | 6/2008 |
| JP | 2008-251270 A | 10/2008 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2019-179696 A | 10/2019 |
| JP | 2020-160305 A | 10/2020 |
| JP | 2021-012366 A | 2/2021 |
| KR | 2009-0021442 A | 3/2009 |
| KR | 2020-0046035 A | 5/2020 |
| KR | 2021-0004867 A | 1/2021 |
| TW | 201324899 | 6/2013 |
| TW | 202104541 | 2/2021 |
| WO | WO-2019/038619 | 2/2019 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and Beol IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

International Search Report (Application No. PCT/IB2022/050335) Dated Apr. 19, 2022.

Written Opinion (Application No. PCT/IB2022/050335) Dated Apr. 19, 2022.

Taiwanese Office Action (Application No. 111102305) Dated Sep. 12, 2025.

* cited by examiner

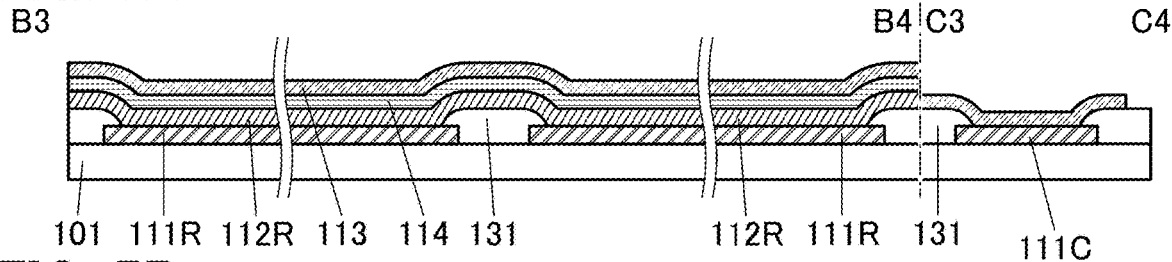
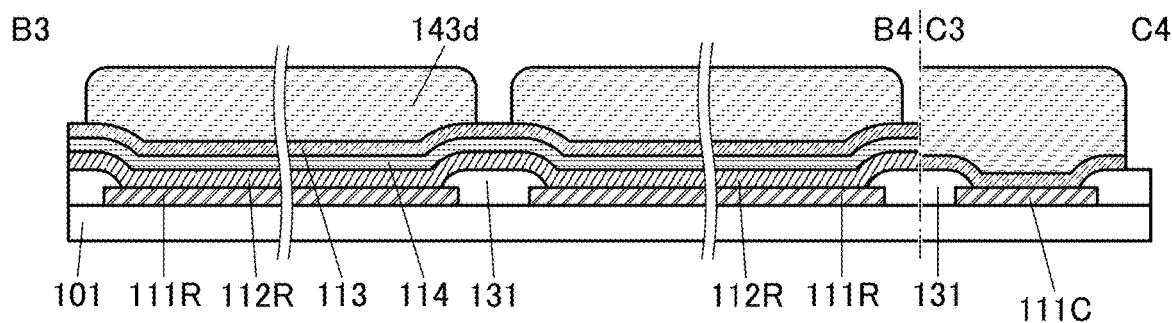
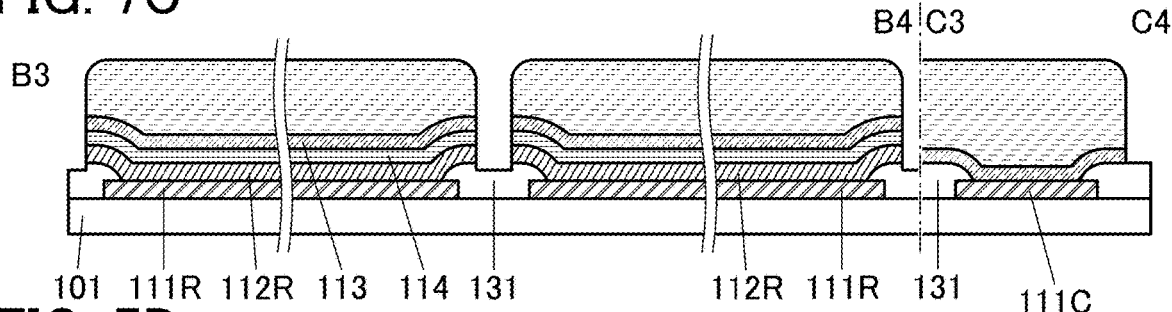
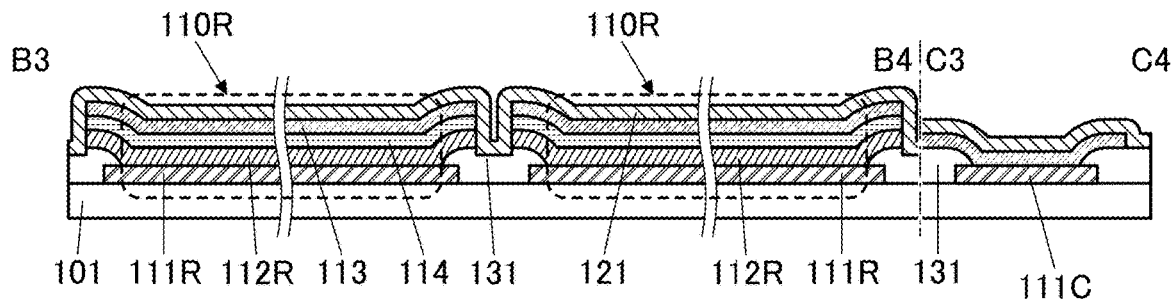
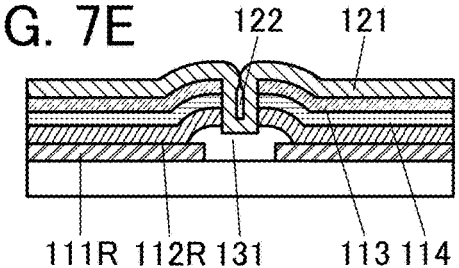

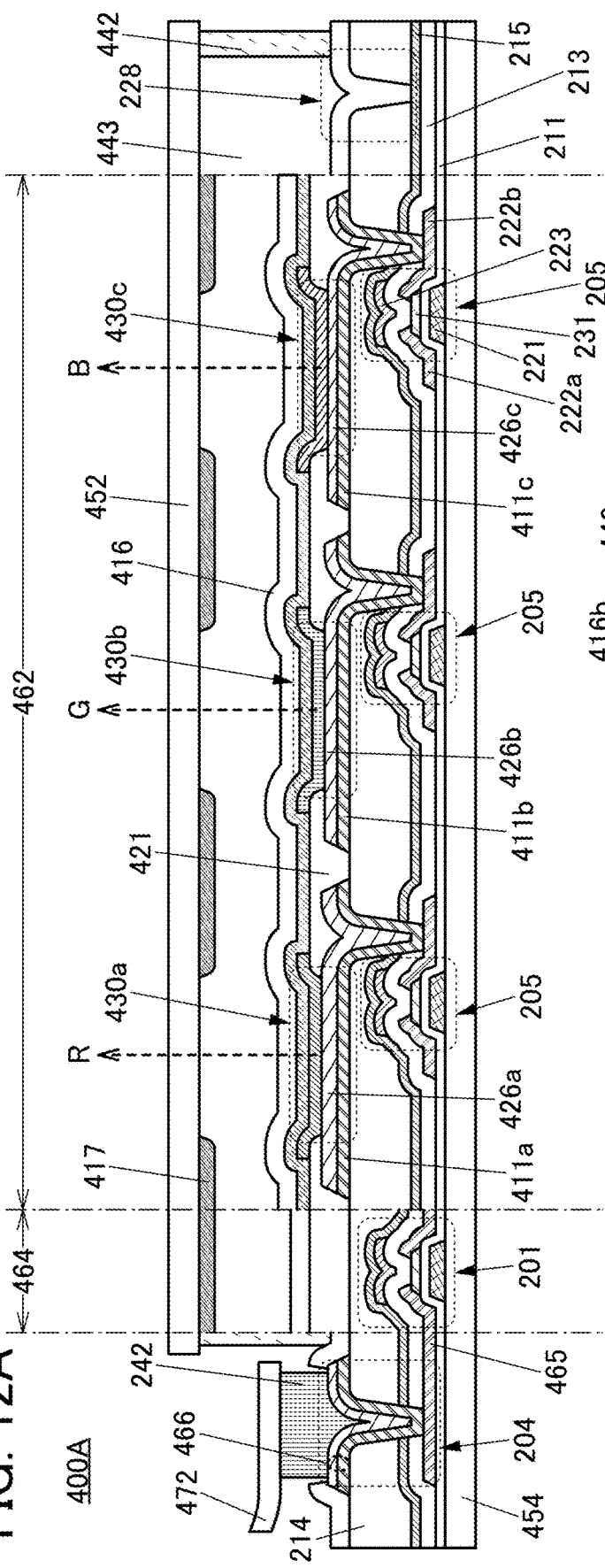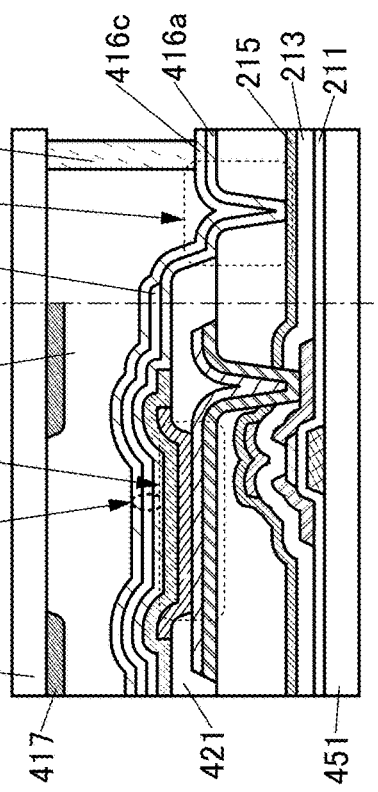

FIG. 22A
FIG. 22B
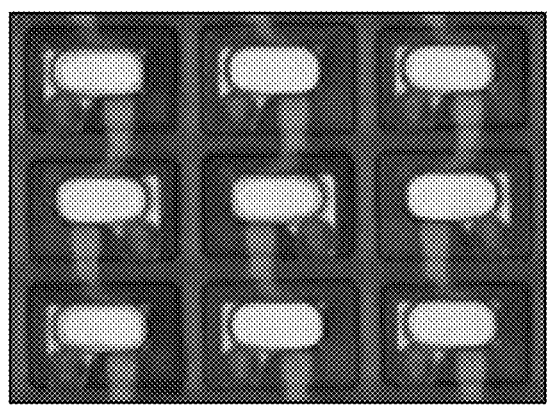
FIG. 22C  FIG. 22D  FIG. 22E
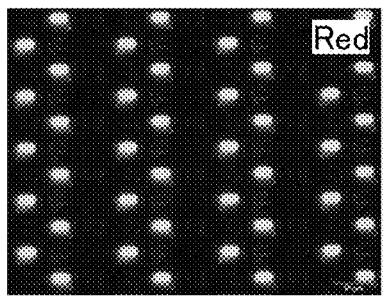 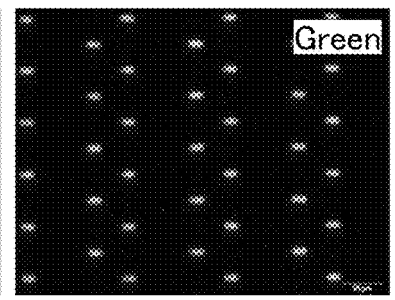 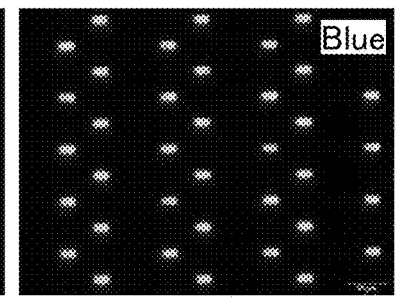

DISPLAY DEVICE

TECHNICAL FIELD

One embodiment of the present invention relates to a display device. One embodiment of the present invention relates to a method for manufacturing a display device.

Note that one embodiment of the present invention is not limited to the above technical field. Examples of a technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, higher-resolution display panels have been required. Examples of devices that require high-resolution display panels include a smartphone, a tablet terminal, and a laptop personal computer. Furthermore, higher resolution has been required for a stationary display device such as a television device or a monitor device along with an increase in definition. An example of a device required to have the highest resolution is a device for virtual reality (VR) or augmented reality (AR).

Examples of a display device that can be used for a display panel include, typically, a liquid crystal display device, a light-emitting apparatus including a light-emitting element such as an organic EL (Electro Luminescence) element or a light-emitting diode (LED), and electronic paper performing display by an electrophoretic method or the like.

For example, the basic structure of an organic EL element is a structure in which a layer containing a light-emitting organic compound is provided between a pair of electrodes. By voltage application to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

REFERENCE

Patent Document

[Patent Document 1] Japanese Published Patent Application No. 2002-324673

SUMMARY OF THE INVENTION

Problems to be Solved by the Invention

An object of one embodiment of the present invention is to provide a display device that can easily achieve higher resolution and a manufacturing method thereof. Another object of one embodiment of the present invention is to provide a display device with both high display quality and high resolution. Another object of one embodiment of the present invention is to provide a display device with high contrast. Another object of one embodiment of the present invention is to provide a highly reliable display device.

Another object of one embodiment of the present invention is to provide a display device having a novel structure and a method for manufacturing a display device. Another object of one embodiment of the present invention is to provide a method for manufacturing the above-described display device with high yield. Another object of one embodiment of the present invention is to at least reduce at least one of problems of the conventional technique.

Note that the description of these objects does not preclude the existence of other objects. One embodiment of the present invention does not have to achieve all these objects. Note that objects other than these can be derived from the descriptions of the specification, the drawings, the claims, and the like.

Means for Solving the Problems

One embodiment of the present invention is a display device including a first light-emitting element and a second light-emitting element. The first light-emitting element includes a first pixel electrode, a first EL layer, and a common electrode. The second light-emitting element includes a second pixel electrode, a second EL layer, and the common electrode. An insulating layer is included between the first pixel electrode and the second pixel electrode. The insulating layer includes a first region overlapping with the first EL layer, a second region overlapping with the second EL layer, and a third region positioned between the first region and the second region and overlapping with neither the first EL layer nor the second EL layer. A side surface of the first EL layer and a side surface of the second EL layer are positioned over the insulating layer and are provided to face each other. The common electrode is provided along the side surface of the first EL layer, the side surface of the second EL layer, and a top surface of the insulating layer. A width of the insulating layer is greater than or equal to 2 times and less than or equal to 4 times a distance between the first pixel electrode and the second pixel electrode.

Another embodiment of the present invention is a display device including a first light-emitting element and a second light-emitting element. The first light-emitting element includes a first pixel electrode, a first EL layer, and a common electrode. The second light-emitting element includes a second pixel electrode, a second EL layer, and the common electrode. An insulating layer is included between the first pixel electrode and the second pixel electrode. The insulating layer includes a first region overlapping with the first EL layer, a second region overlapping with the second EL layer, and a third region positioned between the first region and the second region and overlapping with neither the first EL layer nor the second EL layer. A side surface of the first EL layer and a side surface of the second EL layer are positioned over the insulating layer, and are provided to face each other. The common electrode is provided along the side surface of the first EL layer, the side surface of the second EL layer, and a top surface of the insulating layer. A width of the insulating layer is greater than or equal to 2 times and less than or equal to 4 times a distance between the side surface of the first EL layer and the side surface of the second EL layer.

In any of the above embodiments, the insulating layer preferably contains an organic resin.

In any of the above embodiments, a width of the first region of the insulating layer is preferably larger than a width of the third region and is less than or equal to 3 μm, and a width of the second region of the insulating layer is preferably larger than the width of the third region and is less than or equal to 3 µm.

In any of the above embodiments, in the insulating layer, the sum of the width of the first region and the width of the second region is preferably larger than 2 times the width of the third region. Furthermore, the sum of the width of the first region, the width of the second region, and the width of the third region is less than or equal to 6 µm.

In any of the above embodiments, the width of the third region is preferably greater than or equal to 1 µm and less than or equal to 2 µm.

In any of the above embodiments, an effective light-emitting area ratio is preferably greater than or equal to 70% and less than 100%.

Effect of the Invention

According to one embodiment of the present invention, a display device that can easily achieve a higher resolution and a manufacturing method thereof can be provided. Alternatively, a display device with both high display quality and high resolution can be provided. Alternatively, a display device with high contrast can be provided. Alternatively, a highly reliable display device can be provided.

According to one embodiment of the present invention, a display device having a novel structure and a method for manufacturing the display device can be provided. Alternatively, a method for manufacturing the above-described display device with high yield can be provided. According to one embodiment of the present invention, at least one of problems of the conventional technique can be at least reduced.

Note that the description of these effects does not preclude the existence of other effects. One embodiment of the present invention does not have to have all of these effects. Note that effects other than these can be derived from the descriptions of the specification, the drawings, the claims, and the like.

BRIEF DESCRIPTION OF THE DRAWINGS

FIG. 7A to FIG. 7E are diagrams illustrating an example of a manufacturing method of a display device.

FIG. 12A and FIG. 12B are cross-sectional views illustrating examples of a display device.

FIG. 22A is a photograph showing a display state of Example. FIG. 22B to FIG. 22E are optical micrographs of pixels of Example.

MODE FOR CARRYING OUT THE INVENTION

Figure 1A:
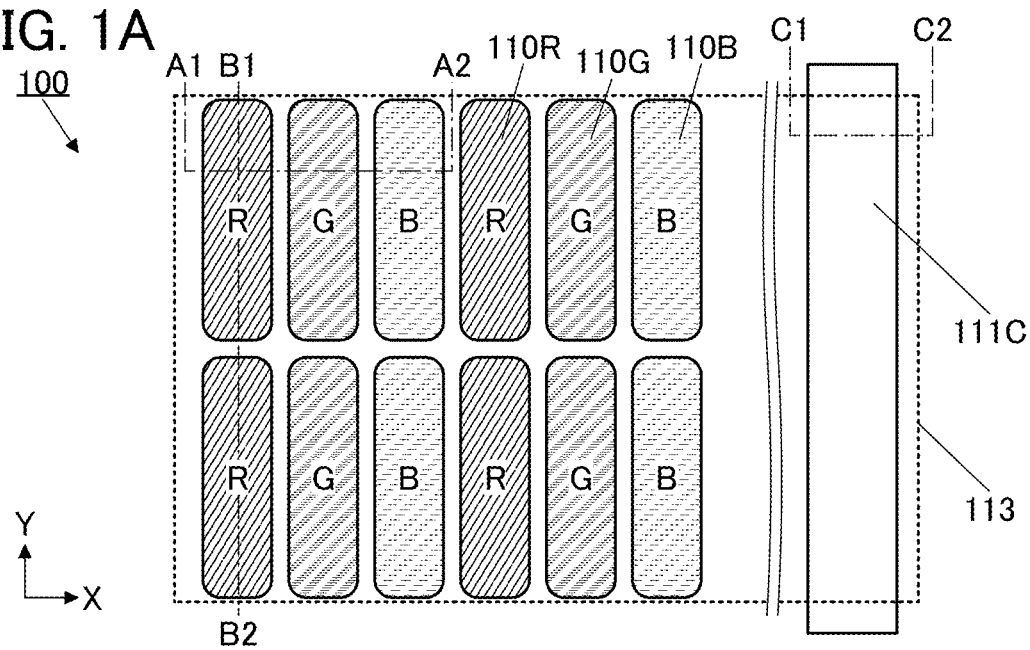
FIG. 1A to FIG. 1D are diagrams illustrating a structure example of a display device.

Hereinafter, embodiments are described with reference to the drawings. Note that the embodiments can be implemented in many different modes, and it is readily understood by those skilled in the art that modes and details thereof can be changed in various ways without departing from the spirit and scope thereof. Thus, the present invention should not be interpreted as being limited to the following description of the embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, the ordinal numbers such as "first" and "second" are used in order to avoid confusion among components and do not limit the number.

In this specification and the like, the term "film" and the term "layer" can be interchanged with each other. For example, in some cases, the term "conductive layer" and the term "insulating layer" can be interchanged with the term "conductive film" and the term "insulating film", respectively.

Note that in this specification, an EL layer means a layer containing at least a light-emitting substance (also referred to as a light-emitting layer) or a stack including the light-emitting layer provided between a pair of electrodes of a light-emitting element.

In this specification and the like, a display panel that is one embodiment of a display device has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, a structure example of a display device of one embodiment of the present invention and an example of a method for manufacturing the display device will be described.

One embodiment of the present invention is a display device including a light-emitting element (also referred to as a light-emitting device). The display device includes at least two light-emitting elements which emit light of different colors. The light-emitting elements each include a pair of electrodes and an EL layer between them. The light-emitting elements are preferably organic EL elements (organic electroluminescent elements). The two or more light-emitting elements emitting different colors include respective EL layers containing different materials. For example, three kinds of light-emitting elements emitting red (R), green (G), and blue (B) light are included, whereby a full-color display device can be obtained.

As a way of forming some or all of the EL layers separately between light-emitting elements of different colors, an evaporation method using a shadow mask such as a metal mask is known. However, this method causes a deviation from the designed shape and position of an island-shaped organic film due to various influences such as the low accuracy of the metal mask position, the positional deviation between the metal mask and a substrate, a warp of the metal mask, and the expansion of outline of the deposited film due to vapor scattering or the like; accordingly, it is difficult to increase resolution and aperture ratio of a display device. Thus, a measure has been taken for pseudo improvement in resolution (also referred to as pixel density) by employing a unique pixel arrangement such as a PenTile arrangement.

In one embodiment of the present invention, fine patterning of an EL layer is performed without a shadow mask such as a metal mask. With this, a display device with high-resolution and a high aperture ratio, which has been difficult to achieve, can be fabricated. Moreover, EL layers can be formed separately on an element basis, enabling the display device to perform extremely clear display with high contrast and high display quality.

Here, a description is made on a case where EL layers in light-emitting elements of two colors are separately formed, for simplicity. First, a stack of a first EL film and a first sacrificial film is formed to cover two pixel electrodes. Next, a resist mask is formed over the first sacrificial film in a position overlapping with one pixel electrode (a first pixel electrode). Then, part of the first sacrificial film which does not overlap with the resist mask and part of the first EL film are etched. At this time, the etching is stopped when the other pixel electrode (a second pixel electrode) is exposed. Thus, part of the first EL film processed into a belt-like or island shape (also referred to as a first EL layer) can be formed over the first pixel electrode, and part of the sacrificial film (also referred to as a first sacrificial layer) can be formed thereover.

Next, a stack of a second EL film and a second sacrificial film is formed. Then, a resist mask is formed in a position overlapping with the second pixel electrode. Then, part of the second sacrificial film that does not overlap with the resist mask and part of the second EL film are etched in a manner similar to the above. As a result, the first EL layer and the first sacrificial layer are provided over the first pixel electrode, and a second EL layer and a second sacrificial layer are provided over the second pixel electrode. In this manner, the first EL layer and the second EL layer can be formed separately. Finally, the first sacrificial layer and the second sacrificial layer are removed to expose the first EL layer and the second EL layer, and then a common electrode is formed, whereby light-emitting elements of two colors can be formed separately.

Furthermore, by repeating the above-described steps, EL layers in light-emitting elements of three or more colors can be separately formed; accordingly, a display device including light-emitting elements of three colors or four or more colors can be achieved.

Here, an electrode (also referred to as a first electrode, a connection electrode, or the like), which is to supply a potential to the common electrode, can be formed on the same plane as the pixel electrode to be electrically connected to the connection electrode and the common electrode. The connection electrode is placed outside the display portion where pixels are provided. In order to prevent the top surface of the connection electrode from being exposed in etching of the first EL film, it is preferable that the first sacrificial layer be provided also over the connection electrode. Also in etching of the second EL film, the second sacrificial layer is preferably provided over the connection electrode. The first sacrificial layer and the second sacrificial layer that are provided over the connection electrode can be removed by etching concurrently with the first sacrificial layer over the first EL layer and with the second sacrificial layer over the second EL layer.

It is difficult to set the distance between the EL layers for different colors to be less than 10 µm with a formation method using a metal mask, for example; however, with use of the above method, the distance can be decreased to be less than or equal to 3 µm, less than or equal to 2 µm, or less than or equal to 1 µm. For example, with use of an exposure apparatus for LSI, the distance can be decreased to be less than or equal to 500 nm, less than or equal to 200 nm, less than or equal to 100 nm, or less than or equal to 50 nm. Accordingly, the area of a non-light-emitting region that may exist between two light-emitting elements can be significantly reduced, and the aperture ratio can be close to 100%, as compared with the case of using a metal mask. For example, the aperture ratio higher than or equal to 50%, higher than or equal to 60%, higher than or equal to 70%, higher than or equal to 80% or higher than or equal to 90% and lower than 100% can be achieved.

Furthermore, a pattern of the EL layer itself can be made extremely smaller than that in the case of using a metal mask. For example, in the case of using a metal mask for forming EL layers separately, a variation in the thickness of the pattern occurs between the center and the edge of the pattern. This causes a reduction in an effective area that can be used as a light-emitting region with respect to the entire pattern area. In contrast, in the above manufacturing method, a pattern is formed by processing a film deposited to have a uniform thickness, which enables a uniform thickness in the pattern; thus, even with a fine pattern, almost the entire area can be used as a light-emitting region. Therefore, the above manufacturing method makes it possible to achieve both a high resolution and a high aperture ratio.

Furthermore, an insulating layer is preferably provided between two adjacent pixel electrodes. The insulating layer is provided to cover an end portion of the pixel electrode. Since a region which is over the pixel electrode and is covered with the insulating layer does not function as a light-emitting region of the light-emitting element, the smaller the width of a region where the insulating layer and the pixel electrode overlap with each other becomes, the more effective light-emitting area ratio, i.e., the aperture ratio of the display device, can be increased.

The end portions of the EL layers are positioned over the insulating layer. In that case, the end portions (side surfaces) of two of the EL layers are placed to face each other over the insulating layer. When the distance between the two EL layers is decreased, the width of the insulating layer can also be decreased; thus, the aperture ratio of the display device can be increased.

The width of the insulating layer provided between the two light-emitting elements is preferably greater than the distance between the two pixel electrodes and is preferably less than or equal to 4 times, further preferably less than or equal to 3.5 times, or still further preferably less than or equal to 3 times the distance; and, in particular, the width of the insulating layer is preferably greater than or equal to 1.5 times, or further preferably greater than or equal to 2 times the distance between the two pixel electrodes. By setting the width of the insulating layer to such a value, even when variation among steps is caused, the end portion of the pixel electrode can be reliably covered by the insulating layer while high aperture ratio is maintained.

The width of the insulating layer provided between two light-emitting elements is preferably greater than the distance between two side surfaces facing each other of the two EL layers and is preferably less than or equal to 4 times, further preferably less than or equal to 3.5 times, or stull further preferably less than or equal to 3 times the distance. In particular, the width of the insulating layer is preferably greater than or equal to 1.5 times, or further preferably greater than or equal to 2 times the distance between the two side surfaces facing each other of the two EL layers. By setting the width of the insulating layer to such a value, even when variation among steps is caused, the end portion of the EL layer can be processed to be reliably positioned over the insulating layer while high aperture ratio is maintained.

As described above, with the above manufacturing method, a display device in which minute light-emitting elements are integrated can be obtained, and it is not necessary to conduct a pseudo improvement in resolution by employing a unique pixel arrangement such as a PenTile arrangement; thus, the display device can achieve resolution higher than or equal to 500 ppi, higher than or equal to 1000 ppi, higher than or equal to 2000 ppi, higher than or equal to 3000 ppi, or higher than or equal to 5000 ppi while having what is called a stripe pattern where R, G, and B are arranged in one direction. Furthermore, a display device with an effective light-emitting area ratio (the aperture ratio) of greater than or equal to 50%, greater than or equal to 60%, greater than or equal to 70% and less than 100% can be achieved.

Note that in this specification and the like, the effective light-emitting area ratio refers to the proportion of the area of a region which can be regarded as a light-emitting region of one pixel, with respect to the area of one pixel that is calculated from repeated pixel pitch in a display device.

Hereinafter, more specific structure examples and manufacturing method examples of a display device of one embodiment of the present invention will be described with reference to drawings.

Structure Example 1

FIG. 1A is a schematic top view of a display device 100 of one embodiment of the present invention. The display device 100 includes a plurality of light-emitting elements 110R exhibiting red, a plurality of light-emitting elements 110G exhibiting green, and a plurality of light-emitting elements 110B exhibiting blue. In FIG. 1A, light-emitting regions of the light-emitting elements are denoted by R, G, and B to easily differentiate the light-emitting elements.

The light-emitting elements 110R, the light-emitting elements 110G, and the light-emitting elements 110B are arranged in a matrix. FIG. 1A illustrates what is called a stripe arrangement, in which the light-emitting elements of the same color are arranged in one direction. Note that the arrangement method of the light-emitting elements is not limited thereto; another arrangement method such as a delta arrangement, a zigzag arrangement, or a PenTile arrangement may also be used.

The light-emitting elements 110R, the light-emitting elements 110G, and the light-emitting elements 110B are arranged in the X direction. The light-emitting elements of the same color are arranged in the Y direction intersecting with the X direction.

As the light-emitting elements 110R, the light-emitting elements 110G, and the light-emitting elements 110B, EL elements such as OLEDs (Organic Light Emitting Diodes) or QLEDs (Quantum-dot Light Emitting Diodes) are preferably used. As a light-emitting substance contained in the EL element, a substance that emits fluorescence (a fluorescent material), a substance that emits phosphorescence (a phosphorescent material), a substance that exhibits thermally activated delayed fluorescence (a thermally activated delayed fluorescent (TADF) material), and the like can be given. As the light-emitting substance contained in the EL element, not only organic compounds but also inorganic compounds (e.g., quantum dot materials) can be used.

Figure 1B:
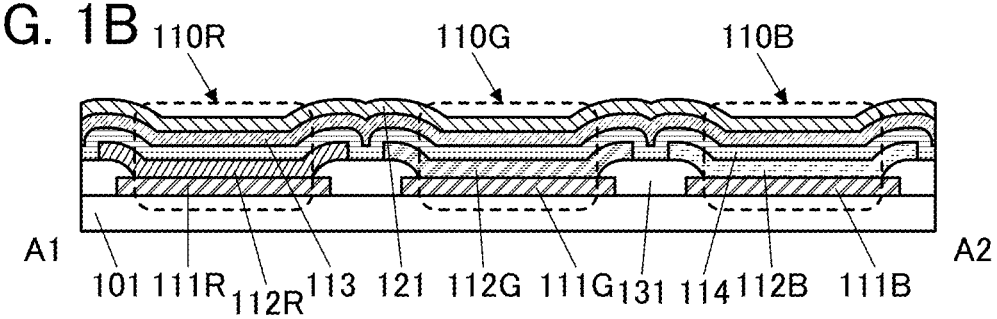
Figure 1C:
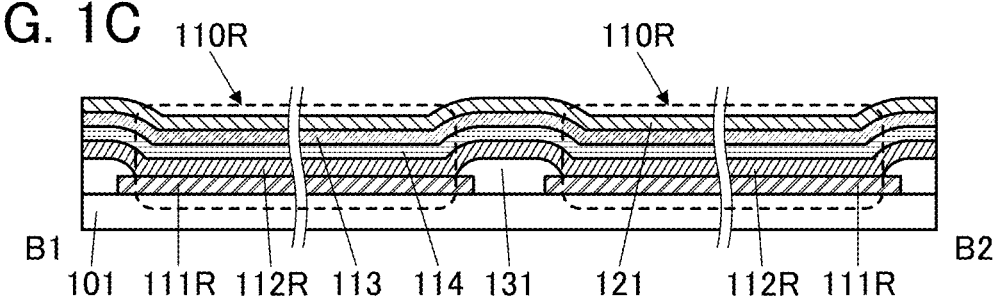

FIG. 1B is a schematic cross-sectional view taken along the dashed-dotted line A1-A2 in FIG. 1A, and FIG. 1C is a schematic cross-sectional view taken along the dashed-dotted line B1-B2.

FIG. 1B illustrates cross sections of the light-emitting element 110R, the light-emitting element 110G, and the light-emitting element 110B. The light-emitting element 110R includes a pixel electrode 111R, an EL layer 112R, an EL layer 114, and a common electrode 113. The light-emitting element 110G includes a pixel electrode 111G, an EL layer 112G, the EL layer 114, and the common electrode 113. The light-emitting element 110B includes a pixel electrode 111B, an EL layer 112B, the EL layer 114, and the common electrode 113. The EL layer 114 and the common electrode 113 are shared by the light-emitting element 110R, the light-emitting element 110G, and the light-emitting element 110B. The EL layer 114 can also be referred to as a common layer.

The EL layer 112R included in the light-emitting element 110R contains at least a light-emitting organic compound that emits light with intensity in the red wavelength range. The EL layer 112G included in the light-emitting element 110G contains at least a light-emitting organic compound that emits light with intensity in the green wavelength range. The EL layer 112B included in the light-emitting element 110B contains at least a light-emitting organic compound that emits light with intensity in the blue wavelength range.

The EL layer 112R, the EL layer 112G, and the EL layer 112B may each include one or more of an electron-injection layer, an electron-transport layer, a hole-injection layer, and a hole-transport layer in addition to the layer containing a light-emitting organic compound (the light-emitting layer). The EL layer 114 can have a structure in which the light-emitting layer is not included. For example, the EL layer 114 includes one or more of an electron-injection layer, an electron-transport layer, a hole-injection layer, and a hole-transport layer.

The pixel electrode 111R, the pixel electrode 111G, and the pixel electrode 111B are provided for the respective light-emitting elements. The common electrode 113 and the EL layer 114 are provided as continuous layers shared by the light-emitting elements. A conductive film having a light-transmitting property with respect to visible light is used for either the respective pixel electrodes or the common electrode 113, and a reflective conductive film is used for the other. When the pixel electrodes are light-transmitting electrodes and the common electrode 113 is a reflective electrode, a bottom-emission display device can be obtained; in contrast, when the respective pixel electrodes are reflective electrodes and the common electrode 113 is a light-transmitting electrode, a top-emission display device can be obtained. Note that when both the pixel electrodes and the common electrode 113 have a light-transmitting property, the display device can have a dual emission structure.

An insulating layer 131 is provided to cover end portions of the pixel electrode 111R, the pixel electrode 111G, and the pixel electrode 111B. An end portion of the insulating layer 131 is preferably tapered. Note that the insulating layer 131 is not necessarily provided when not needed. Note that in this specification and the like, an end portion of an object having a tapered shape indicates that the end portion of the object has a cross-sectional shape in which the angle between a surface of the object and a surface on which the object is formed is greater than 0° and less than 900 in a region of the end portion, preferably, greater than or equal to 5° and less than or equal to 70°, and the thickness continuously increases from the end portion.

The insulating layer 131 preferably contains an organic resin. Using an organic resin for the insulating layer 131 can increase adhesion between the insulating layer 131 and each of the EL layer 112R, the EL layer 112G, and the EL layer 112B, so that the manufacturing yield can be improved. In particular, in the case of processing EL layers by etching, it is preferable to use the insulating layer 131 having high adhesion with the EL layers, in which case a defect such as separation of the EL layers after etching can be decreased.

When an organic resin is used for the insulating layer 131, a surface of the insulating layer 131 can be moderately curved. Thus, coverage with a film formed over the insulating layer 131 can be improved.

Examples of materials that can be used for the insulating film 131 include an acrylic resin, a polyimide resin, an epoxy resin, a polyamide resin, a polyimide-amide resin, a siloxane resin, a benzocyclobutene-based resin, a phenol resin, and precursors of these resins.

The EL layer 112R, the EL layer 112G, and the EL layer 112B each include a region in contact with the top surface of the pixel electrode and a region in contact with a surface of the insulating layer 131. The end portions of the EL layer 112R, the EL layer 112G, and the EL layer 112B are positioned over the insulating layer 131.

As illustrated in FIG. 1B, there is a gap between the two EL layers of the light-emitting elements with different colors. In this manner, the EL layer 112R, the EL layer 112G, and the EL layer 112B are preferably provided with a gap so as not to be in contact with each other. This suitably prevents unintentional light emission (also referred to as crosstalk) from being caused by a current flowing through the EL layers that are continuous between the light-emitting elements of different colors. As a result, the contrast can be increased to achieve a display device with high display quality.

As illustrated in FIG. 1C, the EL layer 112R is formed in a belt-like shape so as to be continuous in the Y direction. When the EL layer 112R and the like are formed in a band-like shape, a space for dividing the layers is not needed and thus the area of a non-light-emitting region between the light-emitting elements can be reduced, resulting in a higher aperture ratio. Note that FIG. 1C illustrates a cross section of the light-emitting element 110R as an example; the light-emitting element 110G and the light-emitting element 110B can also have a similar shape.

A protective layer 121 is provided over the common electrode 113 so as to cover the light-emitting element 110R, the light-emitting element 110G, and the light-emitting element 110B. The protective layer 121 has a function of preventing diffusion of impurities such as water into the light-emitting elements from above.

The protective layer 121 can have, for example, a single-layer structure or a stacked-layer structure including at least an inorganic insulating film. As the inorganic insulating film, for example, an oxide film or a nitride film such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide may be used for the protective layer 121.

As the protective layer 121, a stacked-layer film of an inorganic insulating film and an organic insulating film can be used. For example, a structure in which an organic insulating film is sandwiched between a pair of inorganic insulating films is preferable. Furthermore, the organic insulating film preferably functions as a planarization film. With this, the top surface of the organic insulating film can be flat, and accordingly, coverage with the inorganic insulating film thereover is improved, leading to an improvement in barrier properties. Moreover, the top surface of the protective layer 121 is flat; therefore, when a component (e.g., a color filter, an electrode of a touch sensor, a lens array, or the like) is provided above the protective layer 121, the component can be less affected by an uneven shape caused by the lower structure.

FIG. 1A also illustrates a connection electrode 111C that is electrically connected to the common electrode 113. The connection electrode 111C is supplied with a potential (e.g., an anode potential or a cathode potential) that is to be supplied to the common electrode 113. The connection electrode 111C is provided outside a display region where the light-emitting elements 110R and the like are arranged. In FIG. 1A, the common electrode 113 is denoted by a dashed line.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface shape, a top surface shape of the connection electrode 111C can have a belt-like shape, an L shape, a U-shape (a square bracket shape), a quadrangular shape, or the like.

Figure 1D:
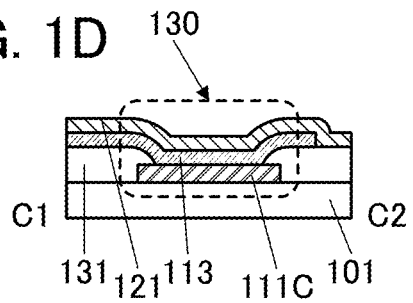

FIG. 1D is a schematic cross-sectional view taken along dashed-dotted line C1-C2 in FIG. 1A. FIG. 1D illustrates a connection portion 130 in which the connection electrode 111C is electrically connected to the common electrode 113. In the connection portion 130, the common electrode 113 is provided over and in contact with the connection electrode 111C and the protective layer 121 is provided to cover the common electrode 113. The insulating layer 131 is provided to cover an end portion of the connection electrode 111C.

Figure 2A:
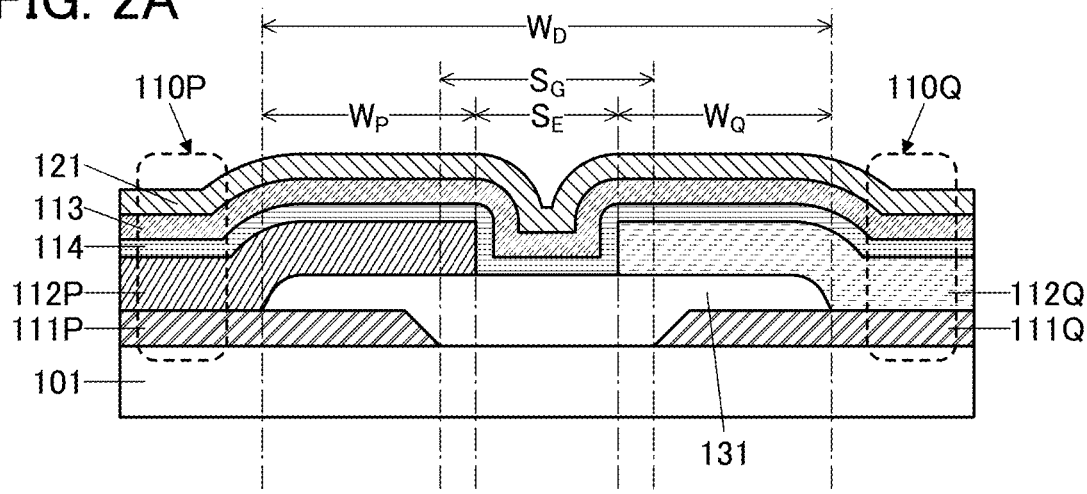
FIG. 2A to FIG. 2C are diagrams each illustrating a structure example of a display device.

Next, a preferable structure of the insulating layer 131 and the vicinity thereof is described in detail. FIG. 2A is an enlarged view of the insulating layer 131 between two adjacent light-emitting elements and the vicinity of the insulating layer 131.

Note that here, a light-emitting element 110P and a light-emitting element 110Q are illustrated as two given adjacent light-emitting elements. Each of the light-emitting element 110P and the light-emitting element 110Q independently represents any of the light-emitting element 110R, the light-emitting element 110G, and the light-emitting element 110B. The light-emitting element 110P includes an EL layer 112P and a pixel electrode 111P, and the light-emitting element 110Q includes an EL layer 112Q and a pixel electrode 111Q.

FIG. 2A illustrates a width $W_D$ of the insulating layer 131, a distance $S_G$ between the pixel electrode 111P and the pixel electrode 111Q, and a distance $S_E$ between a side surface of the EL layer 112P and a side surface of the EL layer 112Q.

The insulating layer 131 includes a region overlapping with the EL layer 112P, a region overlapping with the EL layer 112Q, and a region not overlapping with any of these. A width of a region of the insulating layer 131 that overlaps with the EL layer 112P is a width $W_P$, and a width of a region of the insulating layer that overlaps with the EL layer 112Q is $W_Q$. Note that a width of a region of the insulating layer 131 that does not overlap with any of the EL layers is the length obtained by subtracting the width $W_P$ and the width $W_Q$ from the width $W_D$, and is substantially equal to the distance $S_E$.

Here, the width $W_D$ of the insulating layer 131 is made larger than the distance $S_G$ between a pair of pixel electrodes. In particular, the width $W_D$ is preferably greater than or equal to 1.2 times, further preferably greater than or equal to 1.5 times, still further preferably greater than or equal to 2 times, and preferably less than or equal to 8 times, further preferably less than or equal to 6 times, still further preferably less than or equal to 4 times, yet still further preferably less than or equal to 3 times the distance $S_G$. Typically, the width $W_D$ is preferably greater than or equal to 2 times and less than or equal to 4 times the distance $S_G$. As the width $W_D$ is increased, misalignment between the pair of pixel electrodes and the insulating layer 131 becomes permissible; accordingly, the manufacturing yield can be improved. By contrast, as the width $W_D$ is decreased, the resolution, the aperture ratio, and the like can be improved. Setting the width $W_D$ within the above-described range enables both a high manufacturing yield and a high resolution or aperture ratio.

In addition, the width $W_D$ of the insulating layer 131 is made larger than the distance $S_E$ between the side surface of the EL layer 112P and the side surface of the EL layer 112Q. In particular, the width $W_D$ is preferably greater than or equal to 1.2 times, further preferably greater than or equal to 1.5 times, still further preferably greater than or equal to 2 times, and preferably less than or equal to 8 times, further preferably less than or equal to 6 times, still further preferably less than or equal to 4 times, yet still further preferably less than or equal to 3 times the distance $S_E$. Typically, the width $W_D$ is preferably greater than or equal to 2 times and less than or equal to 4 times the distance $S_E$. As the width $W_D$ is increased, misalignment between the end portions of the EL layers and the insulating layer 131 becomes permissible; accordingly, the manufacturing yield can be improved. By contrast, as the width $W_D$ is decreased, the resolution, the aperture ratio, and the like can be improved. Setting the width $W_D$ within the above-described range enables both a high manufacturing yield and a high resolution or aperture ratio.

Furthermore, the width $W_P$ of the region of the insulating layer 131 that overlaps with the EL layer 112P is preferably larger than the width of a region of the insulating layer 131 that overlaps with neither the EL layer 112P nor the EL layer 112Q (i.e., the distance $S_E$). Moreover, the width $W_Q$ of the region that overlaps with the EL layer 112Q is preferably larger than the distance $S_E$. Each of the width $W_P$ and the width $W_Q$ is preferably less than or equal to 6 µm, further preferably less than or equal to 5 µm, still further preferably less than or equal to 4 µm, yet further preferably less than or equal to 3 µm, yet still further preferably less than or equal to 2 µm. Typically, each of the width $W_P$ and the width $W_Q$ is preferably less than or equal to 3 µm.

In addition, the sum of the width $W_P$ and the width $W_Q$ of the insulating layer 131 is preferably larger than the distance obtained by doubling the distance $S_E$. Furthermore, the sum of the width $W_P$, the width $W_Q$, and the distance $S_E$ of the insulating layer 131, i.e., the width $W_D$ of the insulating layer 131 is preferably less than or equal to 12 µm, further preferably less than or equal to 10 µm, still further preferably less than or equal to 8 µm, yet further preferably less than or equal to 6 µm, yet still further preferably less than or equal to 5 µm. Typically, the width $W_D$ is greater than or equal to 2 times the distance $S_E$ and is preferably less than or equal to 6 µm.

In addition, as the distance $S_E$ between the EL layer 112P and the EL layer 112Q is decreased, the resolution and the aperture ratio can be increased. By contrast, as the distance $S_E$ is increased, the effect of the difference in the manufacturing steps between the EL layer 112P and the EL layer 112Q becomes permissible, which leads to an increase in manufacturing yield. The distance $S_E$ is preferably greater than or equal to 0.5 µm and less than or equal to 5 µm, further preferably greater than or equal to 1 µm and less than or equal to 3 µm, still further preferably greater than or equal to 1 µm and less than or equal to 2.5 µm, yet further preferably greater than or equal to 1 µm and less than or equal to 2 µm. Typically, the distance $S_E$ is preferably greater than or equal to 1 µm and less than or equal to 2 µm (e.g., 1.5 µm or a neighborhood thereof).

The above-described relation between the insulating layer 131, the EL layer 112P, the EL layer 112Q, the pixel electrode 111P, and the pixel electrode 111Q, which are between the two adjacent light-emitting elements, makes it possible to achieve a display device with a high aperture ratio. For example, the aperture ratio (the effective light-emitting area ratio) can be increased to greater than or equal to 40%, greater than or equal to 50%, furthermore greater than or equal to 60%, furthermore greater than or equal to 65%, furthermore greater than or equal to 70%.

FIG. 2A is an example of the case where the end portion of the EL layer 112P does not overlap with the pixel electrode 111P and the end portion of the EL layer 112Q does not overlap with the pixel electrode 111Q. Moreover, in a plan view, the end portion of the EL layer 112P and the end portion of the EL layer 112Q are positioned between the pair of pixel electrodes.

Figure 2B:
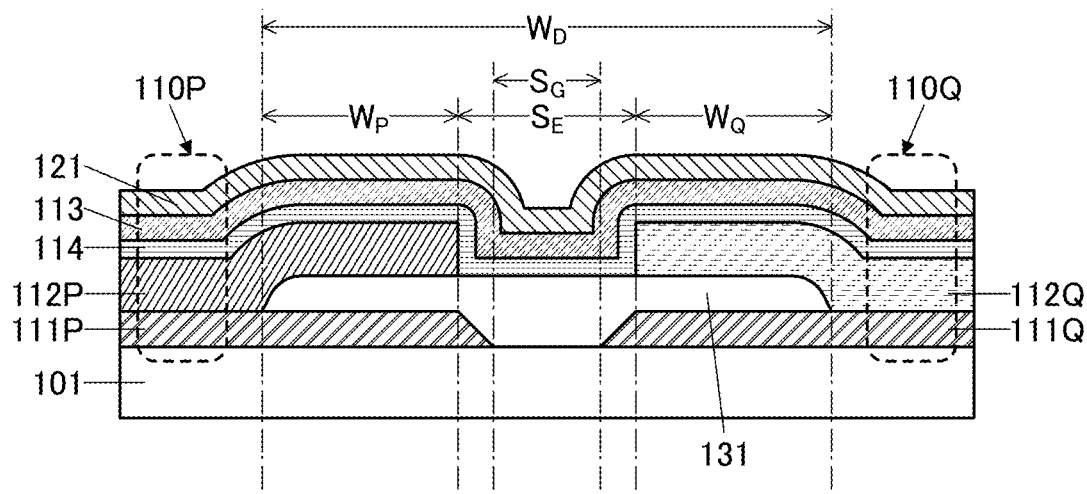

By contrast, FIG. 2B illustrates an example of the case where the end portion of the EL layer 112P overlaps with the pixel electrode 111P and the end portion of the EL layer 112Q overlaps with the pixel electrode 111Q. In addition, in a plan view, the end portion of the pixel electrode 111P and the end portion of the pixel electrode 111Q are positioned between the end portions facing each other of the two adjacent EL layers.

Note that a structure may be employed in which an end portion of one of a pair of EL layers overlaps with the pixel electrode and an end portion of the other does not overlap with the pixel electrode. Alternatively, a structure may be employed in which an end portion of one of the pixel electrodes overlaps with the EL layer, and an end portion of the other does not overlap with the EL layer.

Figure 2C:
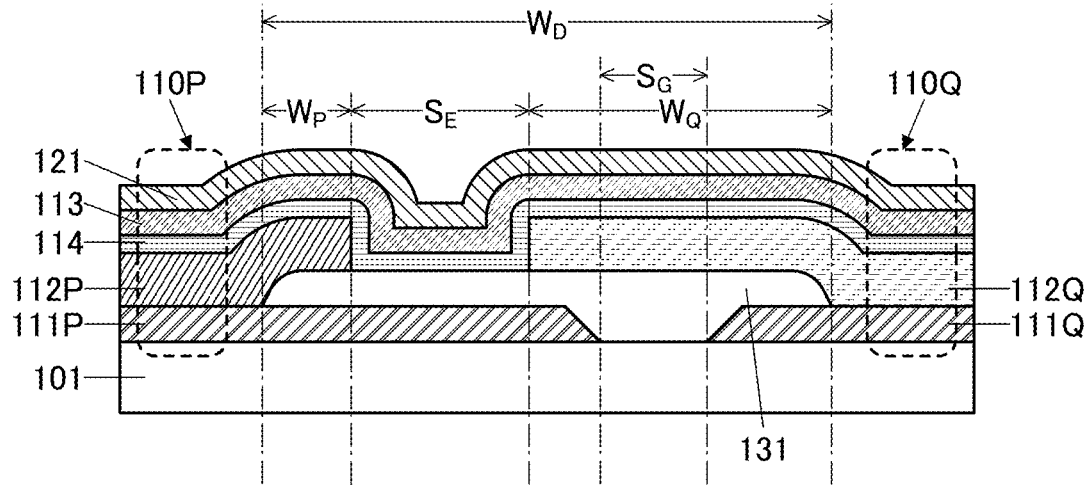

As illustrated in FIG. 2C, end portions of the pair of EL layers may overlap with one of the pixel electrodes. In addition, end portions of the pair of pixel electrodes may overlap with one EL layer.

The above is the description of the structure example of the insulating layer 131 and the vicinity thereof.

Manufacturing Method Example 1

Figure 3A:
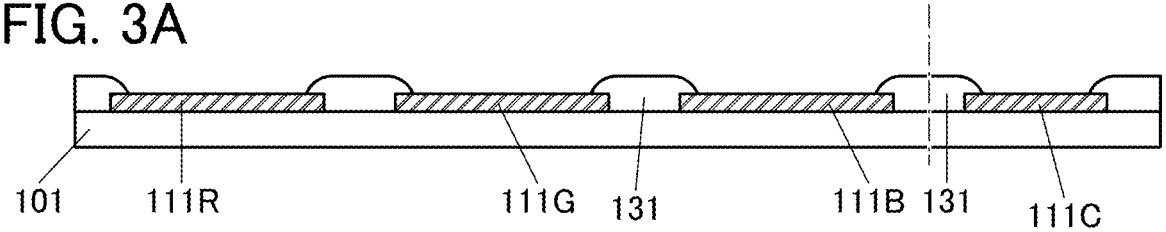
FIG. 3A to FIG. 3F are diagrams illustrating an example of a method for manufacturing a display device.

An example of a method for manufacturing the display device of one embodiment of the present invention is described below with reference to the drawings. Here, description is made using the display device 100 described in the above structure example as an example. FIG. 3A to FIG. 4F are schematic cross-sectional views in steps of the manufacturing method of the display device described below. In FIG. 3A and the like, schematic cross-sectional views of the connection portion 130 and the vicinity thereof are also illustrated on the right side.

Note that thin films included in the display device (insulating films, semiconductor films, conductive films, or the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. An example of a thermal CVD method is a metal organic CVD (MOCVD) method.

Alternatively, thin films included in the display device (insulating films, semiconductor films, conductive films, or the like) can be formed by a method such as spin coating, dipping, spray coating, ink-jetting, dispensing, screen printing, offset printing, doctor blade coating, slit coating, roll coating, curtain coating, or knife coating.

When the thin films included in the display device are processed, a photolithography method or the like can be used. Besides, a nanoimprinting method, a sandblasting method, a lift-off method, or the like may be used for the processing of the thin films. Alternatively, island-shaped thin films may be directly formed by a deposition method using a shielding mask such as a metal mask.

There are the following two typical examples of a photolithography method. In one of the methods, a resist mask is formed over a thin film that is to be processed, the thin film is processed by etching or the like, and then the resist mask is removed. In the other method, a photosensitive thin film is deposited and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or combined light of any of them. Alternatively, ultraviolet light, KrF laser light, ArF laser light, or the like can be used. Exposure may be performed by liquid immersion exposure technique. As the light used for the exposure, extreme ultraviolet (EUV) light, X-rays, or the like may be used. Furthermore, instead of the light used for the exposure, an electron beam can also be used. It is preferable to use extreme ultraviolet light, X-rays, or an electron beam in which case extremely minute processing can be performed. Note that a photomask is not needed when exposure is performed by scanning with a beam such as an electron beam.

For etching of the thin film, a dry etching method, a wet etching method, a sandblast method, or the like can be used.

[Preparation for Substrate 101]

As a substrate 101, a substrate having at least heat resistance high enough to withstand the following heat treatment can be used. In the case where an insulating substrate is used as the substrate 101, a glass substrate, a quartz substrate, a sapphire substrate, a ceramic substrate, an organic resin substrate, or the like can be used. Alternatively, a single crystal semiconductor substrate or a polycrystalline semiconductor substrate using silicon, silicon carbide, or the like as a material, a compound semiconductor substrate of silicon germanium or the like, a semiconductor substrate such as an SOI substrate can be used.

As the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

[Formation of pixel electrode 111R, 111G, 111B, and connection electrode 111C]

Next, the pixel electrode 111R, the pixel electrode 111G, the pixel electrode 111B, and the connection electrode 111C are formed over the substrate 101. First, a conductive film to be the pixel electrodes is deposited, a resist mask is formed by a photolithography method, and an unnecessary portion of the conductive film is removed by etching. After that, the resist mask is removed to form the pixel electrode 111R, the pixel electrode 111G, and the pixel electrode 111B.

In the case where a conductive film having a reflective property with respect to visible light is used as each pixel electrode, it is preferable to use a material (e.g., silver or aluminum) having reflectance as high as possible in the whole wavelength range of visible light. This can increase color reproducibility as well as light extraction efficiency of the light-emitting elements.

[Formation of Insulating Layer 131]

Next, the insulating layer 131 is formed so as to cover the end portions of the pixel electrode 111R, the pixel electrode 111G, and the pixel electrode 111B (FIG. 3A). An organic insulating film or an inorganic insulating film can be used for the insulating layer 131. The end portion of the insulating layer 131 is preferably tapered to improve step coverage with an EL film formed later. In particular, when an organic insulating film is used, a photosensitive material is preferably used so that the shape of the end portion can be easily controlled by the conditions of light exposure and development.

[Formation of EL Film 112Rf]

Subsequently, an EL film 112Rf to be the EL layer 112R later is deposited over the pixel electrode 111R, the pixel electrode 111G, the pixel electrode 111B, and the insulating layer 131.

The EL film 112Rf includes at least a film containing a light-emitting compound. Besides, a structure in which one or more of films functioning as an electron-injection layer, an electron-transport layer, a charge-generation layer, a hole-transport layer, and a hole-injection layer are stacked may be employed. The EL film 112Rf can be formed by, for example, an evaporation method, a sputtering method, an inkjet method, or the like. Without limitation to this, the above-described deposition method can be used as appropriate.

For example, the EL film 112Rf is preferably a stacked film in which a hole-injection layer, a hole-transport layer, a light-emitting layer, and an electron-transport layer are stacked in this order. In that case, a film including the electron-injection layer can be used as the EL layer 114 formed later. In particular, providing the electron-transport layer that covers the light-emitting layer can inhibit the light-emitting layer from being damaged by a subsequent photolithography step or the like, so that a highly reliable light-emitting element can be manufactured. Furthermore, when a layer containing the same organic compound is used as an electron-transport layer used for the EL film 112Rf or the like and as the electron-injection layer used for the EL layer 114 formed later, the layers are bonded to each other favorably, whereby a light-emitting element with high emission efficiency and reliability can be achieved. For example, an organic compound having an electron-transport property can be used for an electron-transport layer, and a material containing the organic compound and a metal can be used for an electron-injection layer.

The EL film 112Rf is preferably formed so as not to be provided over the connection electrode 111C. For example, in the case where the EL film 112Rf is formed by an evaporation method (or a sputtering method), it is preferable that the EL film 112Rf be formed using a shielding mask so as not to be formed over the connection electrode 111C.

[Formation of Sacrificial Film 144a]

Next, a sacrificial film 144a is formed to cover the EL film 112Rf. The sacrificial film 144a is provided in contact with the top surface of the connection electrode 111C.

As the sacrificial film 144a, it is possible to use a film highly resistant to etching treatment performed on various EL films such as the EL film 112Rf, i.e., a film having high etching selectivity. Furthermore, as the sacrificial film 144a, it is possible to use a film having high etching selectivity with respect to protective films such as a protective film 146a described later. Moreover, as the sacrificial film 144a, it is possible to use a film that can be removed by a wet etching method that is less likely to cause damage to the EL film.

For example, an inorganic film such as a metal film, an alloy film, a metal oxide film, a semiconductor film, or an inorganic insulating film can be used as the sacrificial film 144a. The sacrificial film 144a can be formed by various kinds of deposition methods such as a sputtering method, an evaporation method, a CVD method, and an ALD method. In particular, an ALD method causes less damage to a layer where a film is to be formed; for this reason, the sacrificial film 144a, which is directly formed on the EL film 112Rf, is preferably formed by an ALD method.

For the sacrificial film 144a, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used. It is particularly preferable to use a low-melting-point material such as aluminum or silver.

Alternatively, a metal oxide such as an indium gallium zinc oxide (In—Ga—Zn oxide, also referred to as IGZO) can be used for the sacrificial film 144a. It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon or the like can also be used.

Note that an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more kinds selected from gallium, aluminum, and yttrium.

Furthermore, an inorganic insulating material such as aluminum oxide, hafnium oxide, or silicon oxide can be used for the sacrificial film 144a.

Moreover, a material that can be dissolved in a solvent chemically stable with respect to at least the uppermost film of the EL film 112Rf is preferably used for the sacrificial film 144a. In particular, a material that is dissolved in water or alcohol can be suitably used for the sacrificial film 144a. In deposition of the sacrificial film 144a, it is preferable that application of such a material dissolved in a solvent such as water or alcohol be performed by a wet deposition method and followed by heat treatment for evaporating the solvent. At this time, the heat treatment is preferably performed in a reduced-pressure atmosphere, in which case the solvent can be removed at a low temperature in a short time and thermal damage to the EL film 112Rf can be reduced accordingly.

Examples of the wet deposition method that can be used for the formation of the sacrificial film 144a include spin coating, dipping, spray coating, ink-jetting, dispensing, screen printing, offset printing, doctor blade coating, slit coating, roll coating, curtain coating, and knife coating.

For the sacrificial film 144a, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used.

[Formation of Protective Film 146a]

Figure 3B:
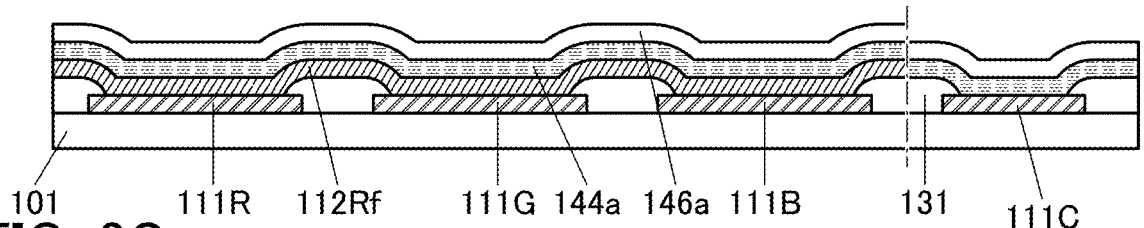

Next, the protective film 146a is formed over the sacrificial film 144a (FIG. 3B).

The protective film 146a is a film used as a hard mask when the sacrificial film 144a is etched later. In a later step of processing the protective film 146a, the sacrificial film 144a is exposed. Thus, the combination of films having high etching selectivity therebetween is selected for the sacrificial film 144a and the protective film 146a. It is thus possible to select a film that can be used for the protective film 146a depending on an etching condition of the sacrificial film 144a and an etching condition of the protective film 146a.

For example, in the case where dry etching using a gas containing fluorine (also referred to as a fluorine-based gas) is performed for the etching of the protective film 146a, silicon, silicon nitride, silicon oxide, tungsten, titanium, molybdenum, tantalum, tantalum nitride, an alloy containing molybdenum and niobium, an alloy containing molybdenum and tungsten, or the like can be used for the protective film 146a. Here, for example, a metal oxide film such as IGZO or ITO is given as a film having high etching selectivity (that is, enabling low etching rate) in dry etching using the fluorine-based gas, and such a film can be used as the sacrificial film 144a.

Without being limited to the above, a material of the protective film 146a can be selected from a variety of materials depending on the etching condition of the sacrificial film 144a and the etching condition of the protective film 146a. For example, any of the films that can be used for the sacrificial film 144a can be used.

As the protective film 146a, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

Alternatively, as the protective film 146a, an oxide film can be used. Typically, an oxide film or an oxynitride film such as silicon oxide, silicon oxynitride, aluminum oxide, aluminum oxynitride, hafnium oxide, or hafnium oxynitride can be used.

For example, for the sacrificial film 144a, an inorganic insulating material, such as aluminum oxide, hafnium oxide, or silicon oxide, formed by an ALD method is preferably used; and for the protective film 146a, a metal oxide containing indium, such as indium gallium zinc oxide (also referred to as an In—Ga—Zn oxide or IGZO), formed by a sputtering method is preferably used.

Alternatively, as the protective film 146a, an organic film that can be used for the EL film 112Rf or the like can be used. For example, the organic film that is used as the EL film 112Rf, the EL film 112Gf, or an EL film 112Bf can be used as the protective film 146a. The use of such an organic film is preferable, in which case the deposition apparatus for the EL film 112Rf or the like can be used in common.
[Formation of resist mask 143a]

Figure 3C:
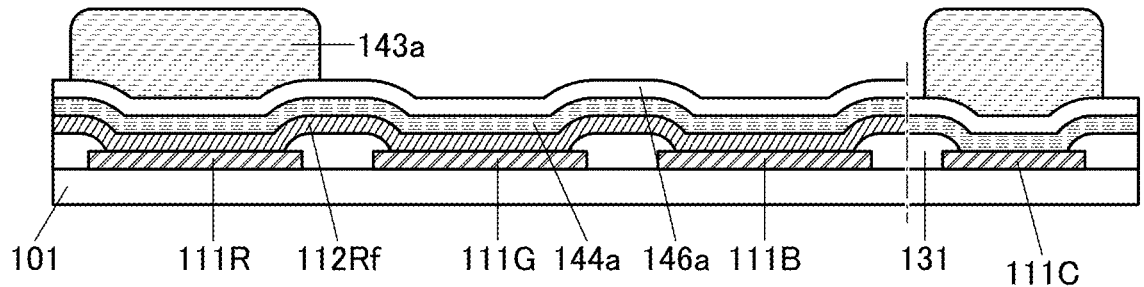

Next, a resist mask 143a is formed over the protective film 146a in a position that overlaps with the pixel electrode 111R and in a position that overlaps with the connection electrode 111C (FIG. 3C).

For the resist mask 143a, a resist material containing a photosensitive resin such as a positive type resist material or a negative type resist material can be used.

Here, in the case where the protective film 146a is not provided and the resist mask 143a is formed over the sacrificial film 144a, if a defect such as a pinhole exists in the sacrificial film 144a, there is a risk of dissolving the EL film 112Rf due to a solvent of the resist material. Such a defect can be prevented from being caused, by using the protective film 146a.

Note that in the case where a film that is unlikely to cause a defect such as a pinhole is used as the sacrificial film 144a, the resist mask 143a may be formed directly on the sacrificial film 144a without using the protective film 146a.
[Etching of Protective Film 146a]

Next, part of the protective film 146a that is not covered with the resist mask 143a is removed by etching, so that a belt-shaped protective layer 147a is formed. At that time, the protective layer 147a is formed also over the connection electrode 111C.

In etching of the protective film 146a, an etching condition with high selectively is preferably employed so that the sacrificial film 144a is not removed by the etching. Either wet etching or dry etching can be performed for the etching of the protective film 146a; with use of dry etching, shrinking of a pattern of the protective film 146a can be inhibited.
[Removal of Resist Mask 143a]

Figure 3D:
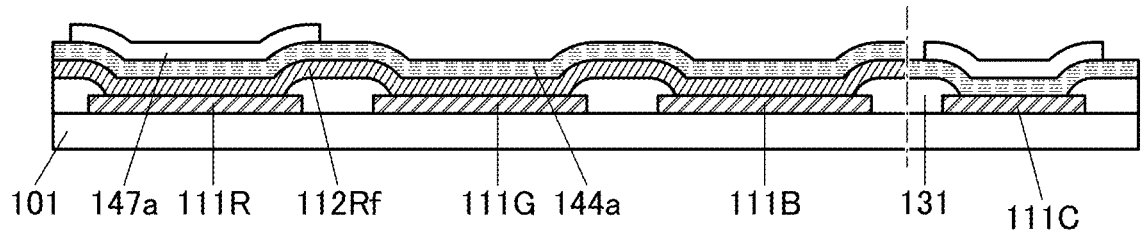

Next, the resist mask 143a is removed (FIG. 3D).

The removal of the resist masks 143a can be performed by wet etching or dry etching. It is particularly preferable to perform dry etching (also referred to as plasma ashing) using an oxygen gas as an etching gas to remove the resist masks 143a.

At this time, the removal of the resist mask 143a is performed in a state where the EL film 112Rf is covered with the sacrificial film 144a; thus, the EL film 112Rf is less affected by the removal. In particular, when the EL film 112Rf is exposed to oxygen, the electrical characteristics are adversely affected in some cases; therefore, it is preferable that the EL film 112Rf be covered by the sacrificial film 144a when etching using an oxygen gas, such as plasma ashing, is performed.
[Etching of Sacrificial Film 144a]

Figure 3E:
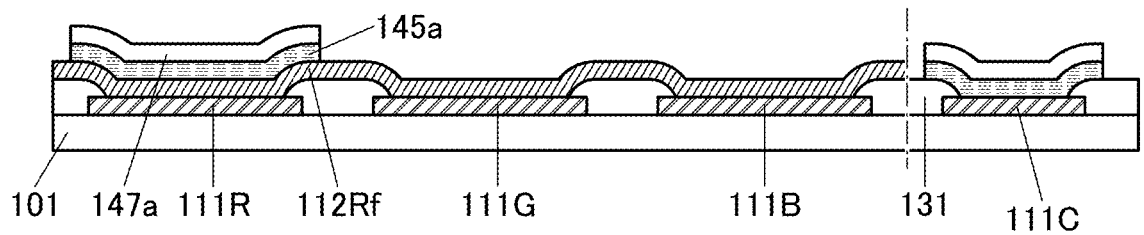

Next, part of the sacrificial film 144a that is not covered with the protective layer 147a is removed by etching with use of the protective layer 147a as a mask, so that a belt-shaped sacrificial layer 145a is formed (FIG. 3E). At that time, the sacrificial layer 145a is formed also over the connection electrode 111C.

Either wet etching or dry etching can be performed for the etching of the sacrificial film 144a; the use of dry etching is preferable, in which case shrinking of the pattern can be inhibited.
[Etching of EL Film 112Rf and Protective Layer 147a]

Figure 3F:
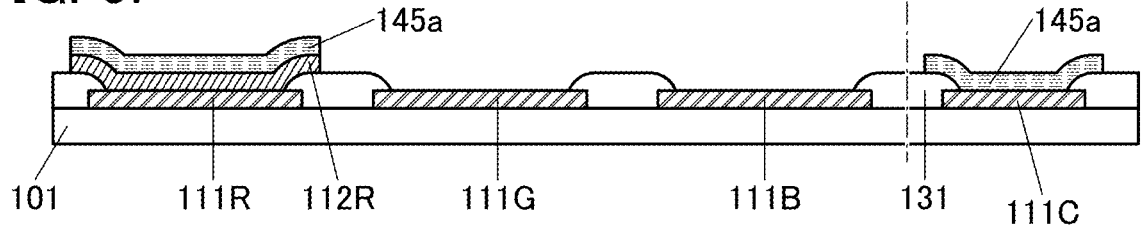

Next, part of the EL film 112Rf that is not covered with the sacrificial layer 145a is removed by etching at the same time as etching of the protective layer 147a, so that a belt-shaped the EL layer 112R is formed (FIG. 3F). At that time, the protective layer 147a over the connection electrode 111C is also removed.

Etching the EL film 112Rf and the protective layer 147a by the same treatment is preferable, in which case the process can be simplified, leading to a reduction in the manufacturing cost of the display device.

In particular, for the etching of the EL film 112Rf, it is preferable to perform dry etching using an etching gas that does not contain oxygen as its main component. This can inhibit the alteration of the EL film 112Rf to achieve a highly reliable display device. Examples of the etching gas that does not contain oxygen as its main component include $CF_4$, $C_4F_8$, $SF_6$, $CHF_3$, $Cl_2$, $H_2O$, $BCl_3$, $H_2$, and a rare gas such as He. Alternatively, a mixed gas of the above gas and a dilute gas that does not contain oxygen can be used as the etching gas.

Note that the etching of the EL film 112Rf and the etching of the protective layer 147a may be performed separately. In that case, either the etching of the EL film 112Rf or the etching of the protective layer 147a may be performed first. It may also be possible that the protective layer 147a is not removed at this point and that the protective layer 147a and the sacrificial layer 145a are removed in a later step of removing the sacrificial layer 145a or the like.

At this step, the EL layer 112R and the connection electrode 111C are covered with the sacrificial layer 145a.
[Formation of EL Film 112Gf]

Next, the EL film 112Gf to be the EL layer 112G later is deposited over the sacrificial layer 145a, the insulating layer 131, the pixel electrode 111G, and the pixel electrode 111B. In that case, similarly to the EL film 112Rf, the EL film 112Gf is preferably not provided over the connection electrode 111C.

The description of the EL film 112Rf can be referred to for the formation method of the EL film 112Gf.
[Formation of Sacrificial Film 144b]

Subsequently, a sacrificial film 144b is formed over the EL film 112Gf. The sacrificial film 144b can be formed in a manner similar to that for the sacrificial film 144a. In particular, the sacrificial film 144b is preferably formed using the same material as the sacrificial film 144a.

At that time, the sacrificial film 144a is formed over the connection electrode 111C so as to cover the sacrificial layer 145a.

[Formation of Protective Film 146b]

Next, a protective film 146b is formed over the sacrificial film 144b. The protective film 146b can be formed in a manner similar to that for the protective film 146a. In particular, the protective film 146b and the protective film 146a are preferably formed using the same material.

[Formation of Resist Mask 143b]

Figure 4A:
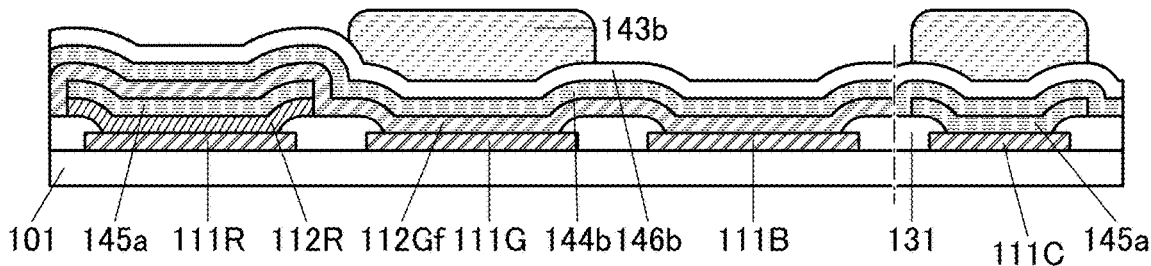
FIG. 4A to FIG. 4F are diagrams illustrating the example of the method for manufacturing the display device.

Subsequently, a resist mask 143b is formed in a region overlapping with the pixel electrode 111G and a region overlapping with the connection electrode 111C, which are over the protective film 146b (FIG. 4A).

The resist mask 143b can be formed in a manner similar to that for the resist mask 143a.

[Etching of Protective Film 146b]

Figure 4B:
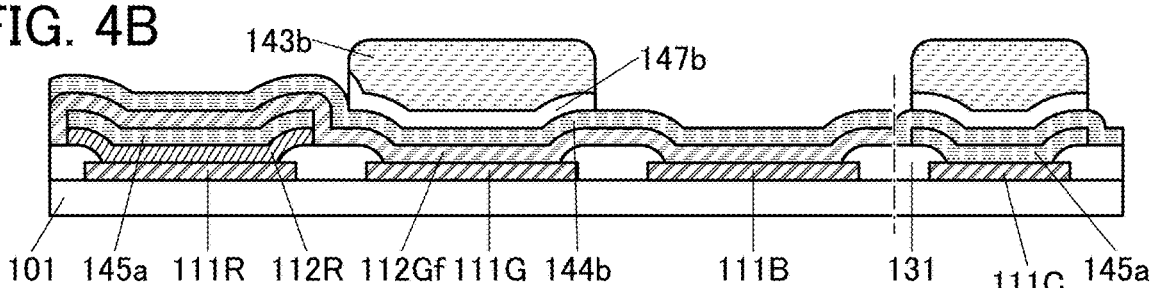

Next, part of the protective film 146b that is not covered with the resist mask 143b is removed by etching, so that a belt-shaped protective layer 147b is formed (FIG. 4B). At that time, the protective layer 147b is formed also over the connection electrode 111C.

For the etching of the protective film 146b, the above description of the protective film 146a can be referred to.

[Removal of Resist Mask 143b]

Subsequently, the resist mask 143b is removed. The above description of the resist mask 143a can be referred to for the removal of the resist mask 143b.

[Etching of Sacrificial Film 144b]

Next, part of the sacrificial film 144b that is not covered with the protective layer 147b is removed by etching with use of the protective layer 147b as a mask, so that a belt-shaped sacrificial layer 145b is formed. At that time, the sacrificial layer 145b is formed also over the connection electrode 111C. The sacrificial layer 145a and the sacrificial layer 145b are stacked over the connection electrode 111C.

The above description of the sacrificial film 144a can be referred to for the etching of the sacrificial film 144b.

[Etching of EL Film 112Gf and Protective Layer 147b]

Figure 4C:
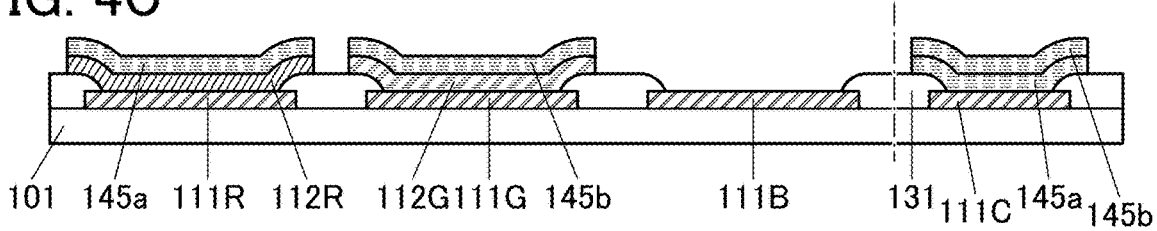

Subsequently, part of the EL film 112Gf that is not covered with the sacrificial layer 145b is removed by etching at the same time as etching of the protective layer 147b, so that a belt-shaped EL layer 112G is formed (FIG. 4C). At that time, the protective layer 147b over the connection electrode 111C is also removed.

For the etching of the EL film 112Gf and the protective layer 147b, the above description of the EL film 112Rf and the protective layer 147a can be referred to.

At this time, the EL layer 112R is protected by the sacrificial layer 145a, and thus can be prevented from being damaged in the etching step of the EL film 112Gf.

In the above manner, the belt-shaped EL layer 112R and the belt-shaped EL layer 112G can be separately formed with high alignment accuracy.

<Formation of EL layer 112B>

Figure 4D:
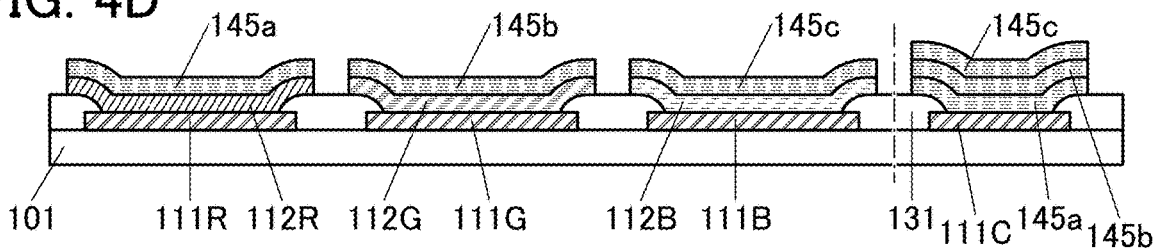

The EL film 112Bf (not illustrated) is subjected to the above steps, whereby an island-shapes EL layer 112B and an island-shaped sacrificial layer 145c can be formed (FIG. 4D).

That is, after the EL layer 112G is formed, the EL film 112Bf, a sacrificial film 144c, a protective film 146c, and a resist mask 143c (each of which is not illustrated) are sequentially formed. After that, the protective film 146c is etched to form a protective layer 147c (not illustrated); then, the resist mask 143c is removed. Subsequently, the sacrificial film 144c is etched to form the sacrificial layer 145c. After that, the protective layer 147c and the EL film 112Bf are etched to form a belt-shaped EL layer 112B.

After the EL layer 112B is formed, the sacrificial layer 145c is formed also over the connection electrode 111C at the same time. The sacrificial layer 145a, the sacrificial layer 145b, and the sacrificial layer 145c are stacked over the connection electrode 111C.

[Removal of Sacrificial Layers]

Figure 4E:
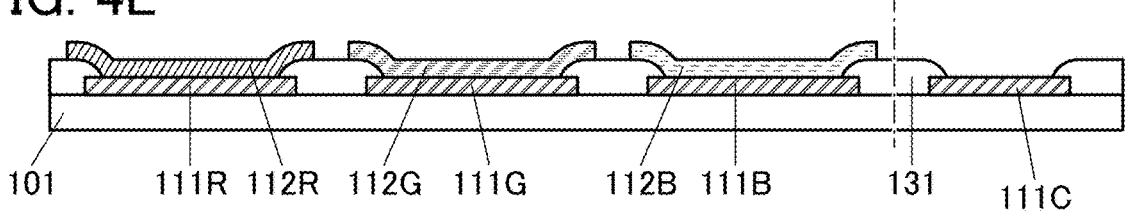

Next, the sacrificial layer 145a, the sacrificial layer 145b, and the sacrificial layer 145c are removed to expose the top surfaces of the EL layer 112R, the EL layer 112G, and the EL layer 112B (FIG. 4E). At that time, the top surface of the connection electrode 111C is also exposed.

The sacrificial layer 145a, the sacrificial layer 145b, and the sacrificial layer 145c can be removed by wet etching or dry etching. At this time, a method that causes damage to the EL layer 112R, the EL layer 112G, and the EL layer 112B as little as possible is preferably employed. In particular, a wet etching method is preferably used. For example, wet etching using a tetramethyl ammonium hydroxide (TMAH) solution, diluted hydrofluoric acid, oxalic acid, phosphoric acid, acetic acid, nitric acid, or a mixed solution thereof is preferably performed.

Alternatively, the sacrificial layer 145a, the sacrificial layer 145b, and the sacrificial layer 145c are preferably removed by being dissolved in a solvent such as water or alcohol. As the alcohol in which the sacrificial layer 145a, the sacrificial layer 145b, and the sacrificial layer 145c can be dissolved, any of various alcohols such as ethyl alcohol, methyl alcohol, isopropyl alcohol (IPA), and glycerin can be used.

After the sacrificial layer 145a, the sacrificial layer 145b, and the sacrificial layer 145c are removed, drying treatment is preferably performed in order to remove water contained in the EL layer 112R, the EL layer 112G, and the EL layer 112B and water adsorbed on the surfaces of the EL layer 112R, the EL layer 112G, and the EL layer 112B. For example, heat treatment is preferably performed in an inert gas atmosphere or a reduced-pressure atmosphere. The heat treatment can be performed at a substrate temperature of higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case drying at a lower temperature is possible.

In this manner, the EL layer 112R, the EL layer 112G, and the EL layer 112B can be formed separately.

[Formation of EL Layer 114]

Next, the EL layer 114 is deposited to cover the EL layer 112R, the EL layer 112G, and the EL layer 112B.

The EL layer 114 can be deposited in a manner similar to that of the EL film 112Rf or the like. In the case where the EL layer 114 is deposited by an evaporation method, the EL layer 114 is preferably deposited using a shielding mask so as not to be deposited over the connection electrode 111C.

[Formation of Common Electrode 113]

Figure 4F:
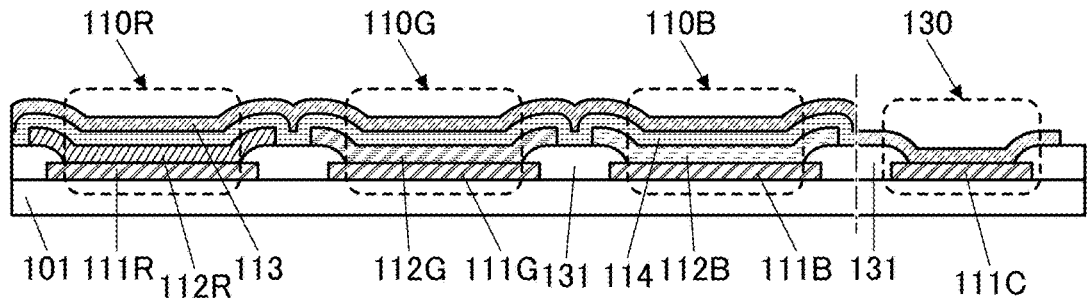

Subsequently, the common electrode 113 is formed to cover the EL layer 114 and the connection electrode 111C (FIG. 4F).

The common electrode 113 can be formed by a method such as an evaporation method or a sputtering method. Alternatively, a film formed by an evaporation method and a film formed by a sputtering method may be stacked. In that case, the common electrode 113 is preferably formed so as to cover a region where the EL layer 114 is deposited. That is, a structure in which an end portion of the EL layer 114 overlap with the common electrode 113 can be obtained. The common electrode 113 is preferably formed using a shielding mask.

The common electrode 113 is electrically connected to the connection electrode 111C outside a display region.

[Formation of Protective Layer]

Next, the protective layer 121 is formed over the common electrode 113. An inorganic insulating film used for the protective layer 121 is preferably deposited by a sputtering method, a PECVD method, or an ALD method. In particular, an ALD method is preferable because it provides excellent step coverage and is less likely to cause a defect such as a pinhole. An organic insulating film is preferably formed by an inkjet method because a uniform film can be formed in a desired area.

Through the above steps, the display device 100 illustrated in FIG. 1B and FIG. 1C can be manufactured.

Note that although the common electrode 113 and the EL layer 114 are formed so as to have different top surface shapes, they may be formed in the same region.

Figure 5A:
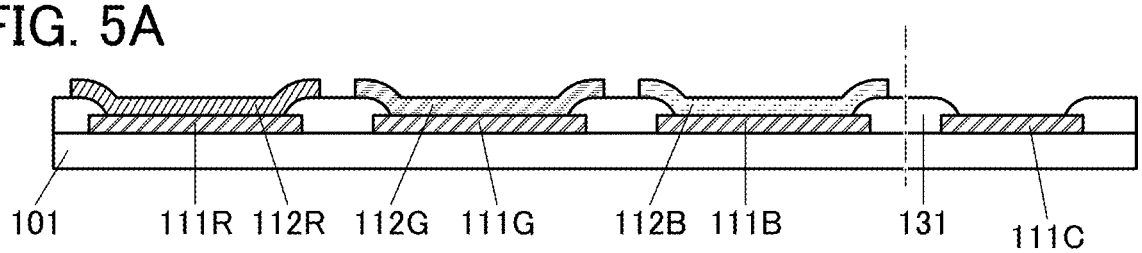
FIG. 5A to FIG. 5C are diagrams illustrating the example of the method for manufacturing the display device.
Figure 5B:
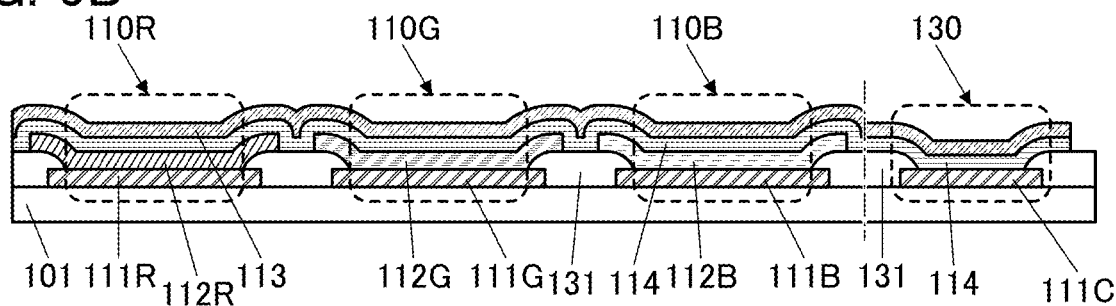

FIG. 5A is a schematic cross-sectional view after the removal of the sacrificial layers in the above description. Subsequently, as illustrated in FIG. 5B, the EL layer 114 and the common electrode 113 are formed with use of the same shielding mask or without using a shielding mask. This can reduce manufacturing cost compared to the case where different shielding masks are used.

As illustrated in FIG. 5B, in the connection portion 130, the EL layer 114 is positioned between the connection electrode 111C and the common electrode 113. In this case, for the EL layer 114, a material with as low electric resistance as possible is preferably used. Alternatively, it is preferable to form the EL layer 114 as thin as possible, in which case the electric resistance of the EL layer 114 in the thickness direction can be reduced. For example, the EL layer 114 is formed using an electron-injection or hole-injection material having a thickness greater than or equal to 1 nm and less than or equal to 5 nm, preferably greater than or equal to 1 nm and less than or equal to 3 nm, whereby the electric resistance between the connection electrode 111C and the common electrode 113 can be made small enough to be negligible in some cases.

Figure 5C:
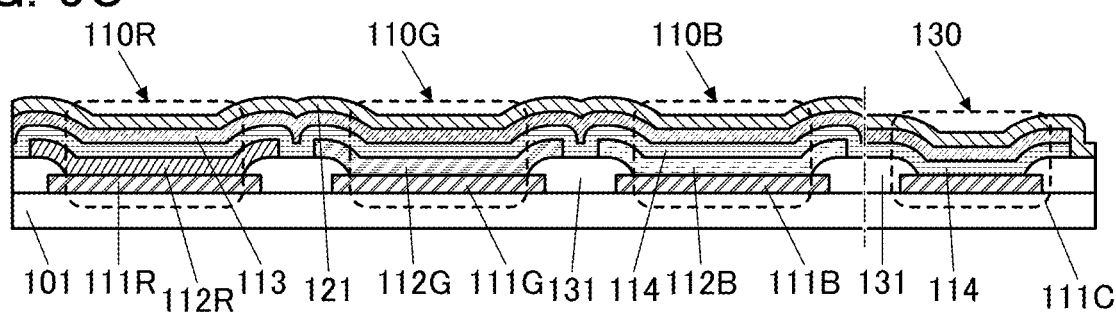

Subsequently, the protective layer 121 is formed as illustrated in FIG. 5C. In this case, as illustrated in FIG. 5C, the protective layer 121 is preferably provided to cover an end portion of the common electrode 113 and the end portion of the EL layer 114. Accordingly, diffusion of impurities such as water or oxygen from the outside to the EL layer 114 and an interface between the EL layer 114 and the common electrode 113 can be effectively prevented.

The above is the description of the example of the method for manufacturing a display device.

Structure Example 2

A structure example of a display device whose structure is partly different from that of the above-described Structure example 1 will be described below. Portions similar to those described above are not described below in some cases.

A display device 100A illustrated in FIG. 6A to FIG. 6D is different from the display device 100 mainly in the shape of the EL layer 114 and the common electrode 113.

Figure 6A:
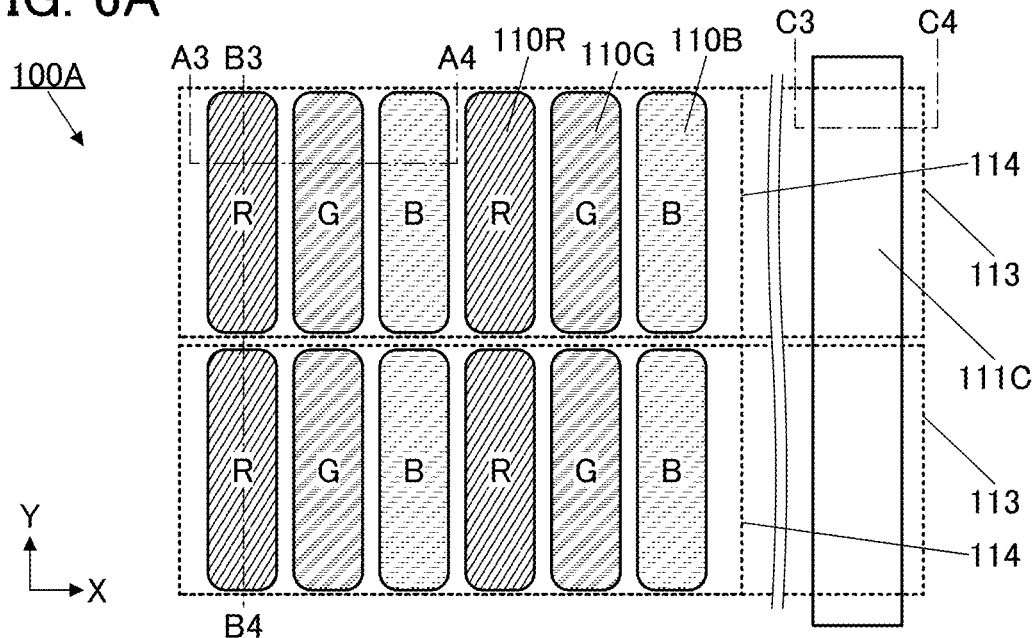
FIG. 6A to FIG. 6D are diagrams illustrating a structure example of a display device.
Figure 6B:
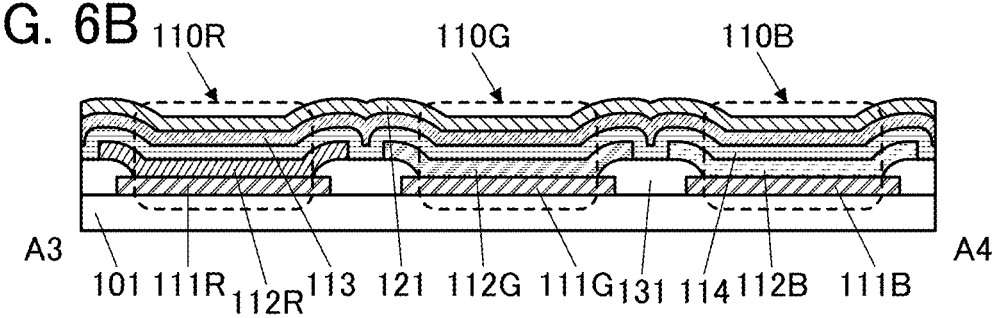
Figure 6C:
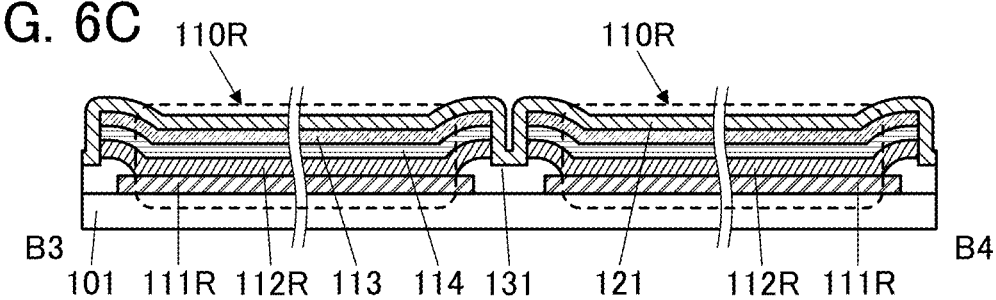
Figure 6D:
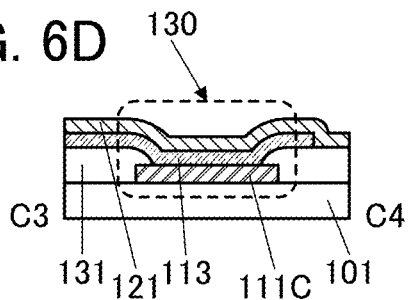

As illustrated in FIG. 6C, in a cross section in the Y direction, the EL layer 112R, the EL layer 114, and the common electrode 113 are separated between the two light-emitting elements 110R. In other words, the EL layer 112R, the EL layer 114, and the common electrode 113 each have an end portion in a portion overlapping with the insulating layer 131.

In addition, the protective layer 121 is provided to cover side surfaces of the EL layer 112R, the EL layer 114, and the common electrode 113 in a region overlapping with the insulating layer 131.

As illustrated in FIG. 6C, a depression may be formed on part of the top surface of the insulating layer 131. In that case, the protective layer 121 is preferably provided along and in contact with the surface of the depression of the insulating layer 131. This is preferable because the contact area between the insulating layer 131 and the protective layer 121 is increased and the adhesion between them is improved.

In FIG. 6A, the outlines of the common electrode 113 and the EL layer 114 are indicated by dashed lines. As illustrated in FIG. 6A, the common electrode 113 and the EL layer 114 each have a belt-like top surface shape whose longitudinal direction is parallel to the X direction. On the other hand, the EL layer 112R has an island-like shape as illustrated in FIG. 6B and FIG. 6C.

Although not illustrated here, the light-emitting element 110G and the light-emitting element 110B can have a similar structure.

Manufacturing Method Example 2

An example of a method for manufacturing the above-described display device 100A will be described below. Note that Manufacturing method example 1 described above is referred to for portions that are the same as those described in Manufacturing method example 1, and description of the portions is omitted in some cases. The manufacturing method example described here is different from Manufacturing method example 1 described above in steps after the formation step of the common electrode 113.

FIG. 7A to FIG. 7D are schematic cross-sectional views of each step described as an example below. Here, a cross section corresponding to dashed-dotted line B3-B4 in FIG. 6A and a cross section corresponding to dashed-dotted line C3-C4 are illustrated side by side.

In a manner similar to the above described Manufacturing method example 1, the steps up to the formation of the common electrode 113 is sequentially performed (FIG. 7A).

Next, a plurality of resist masks 143d are formed over the common electrode 113 (FIG. 7B). The resist mask 143d is formed to have a belt-like top surface shape extending in the X direction. The resist mask 143d overlaps with the pixel electrode 111R. Furthermore, an end portion of the resist mask 143d is provided over the insulating layer 131.

Subsequently, portions of the common electrode 113, the EL layer 114, the EL layer 112R, the EL layer 112G (not illustrated), and the EL layer 112B (not illustrated) that are not covered with the resist mask 143d are removed by etching (FIG. 7C). As a result, the common electrode 113 and the EL layer 114 provided to be continuous and to cover all the pixel electrodes so far, are divided by a slit formed by the above-described etching, whereby a plurality of belt-like common electrodes 113 and EL layers 114 are formed.

As the etching, dry etching is preferably performed. For example, it is preferable that the common electrode 113, the EL layer 114, the EL layer 112R, and the like be successively etched in this order without being exposed to the air by switching an etching gas. Furthermore, a gas that does not contain oxygen as its main component is preferably used as the etching gas.

As illustrated in FIG. 7C, part of the insulating layer 131 may be etched in etching for the common electrode 113, the EL layer 114, the EL layer 112R, and the like to form a depression on the upper portion of the insulating layer 131. Alternatively, the insulating layer 131 is sometimes divided into two by etching of a portion of the insulating layer 131 that is not covered with the resist mask 143d.

Next, the resist masks 143d are removed. The removal of the resist masks 143d can be performed by wet etching or dry etching.

Subsequently, the protective layer 121 is formed (FIG. 7D). The protective layer 121 is provided to cover a side surface of the common electrode 113, a side surface of the EL layer 114, and a side surface of the EL layer 112R. Moreover, the protective layer 121 is preferably provided to be in contact with the top surface of the insulating layer 131.

In addition, as illustrated in FIG. 7E, a gap (also referred to as a void, a space, or the like) 122 is sometimes formed above the insulating layer 131 when the protective layer 121 is formed. The gap 122 may be under reduced pressure or atmospheric pressure. Furthermore, the gap 122 may contain air, nitrogen, a gas such as a noble gas, a deposition gas used for the deposition of the protective layer 121, for example.

The above is the description of the example of the method for manufacturing the display device 100A.

Note that although the resist mask 143d is directly formed over the common electrode 113, a film functioning as a hard mask may be provided over the common electrode 113. At this time, the hard mask is formed with the resist mask 143d serving as a mask; after the removal of the resist mask, the common electrode 113, the EL layer 114, the EL layer 112R, and the like can be etched with use of the hard mask as a mask. Note that at this time, the hard mask may be removed or left.

Modification Example

An example whose structure is partly different from that of the above-described structure example will be described below. Note that hereinafter, the above description is referred to for portions that are the same as those described above, and description of the portions is omitted in some cases.

Modification Example 1

Figure 8A:
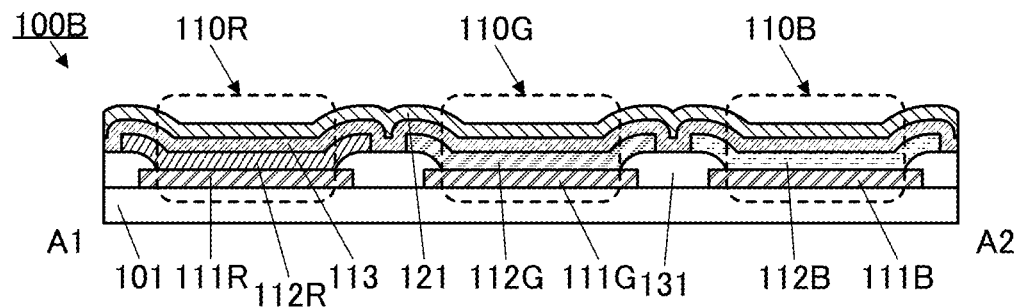
FIG. 8A to FIG. 8C are diagrams illustrating a structure example of a display device.
Figure 8B:
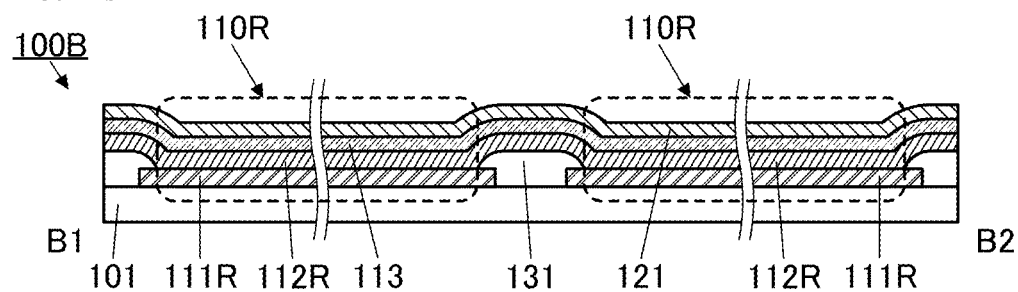

FIG. 8A and FIG. 8B each illustrates a schematic cross-sectional view of a display device 100B. A top view of the display device 100B is similar to that in FIG. 1A. FIG. 8A corresponds to a cross section in the X-direction, and FIG. 8B corresponds to a cross section in the Y direction.

The display device 100B is different from the display device 100 mainly in not including the EL layer 114 which is a common layer.

The common electrode 113 is provided to be in contact with the top surfaces of the EL layer 112R, the EL layer 112G, and the EL layer 112B. Without being provided with the EL layer 114, each of the light-emitting element 110R, the light-emitting element 110G, and the light-emitting element 110B can have s stacked-layer structure completely different from each other; thus, options for materials increase, which can increase the design flexibility.

Figure 8C:
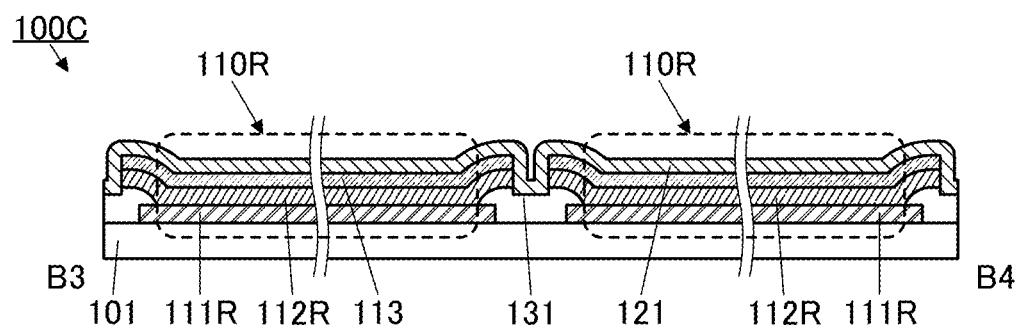

A display device 100C illustrated in FIG. 8C is an example of a case where a slit extending in the X direction is formed in a region of the common electrode 113 that overlaps with the insulating layer 131, like the above-described display device 100A. In the display device 100C, the protective layer 121 is provided to be in contact with the side surface of the common electrode 113, the side surface of the EL layer 112R, and the top surface of the insulating layer 131.

Modification Example 2

Figure 9A:
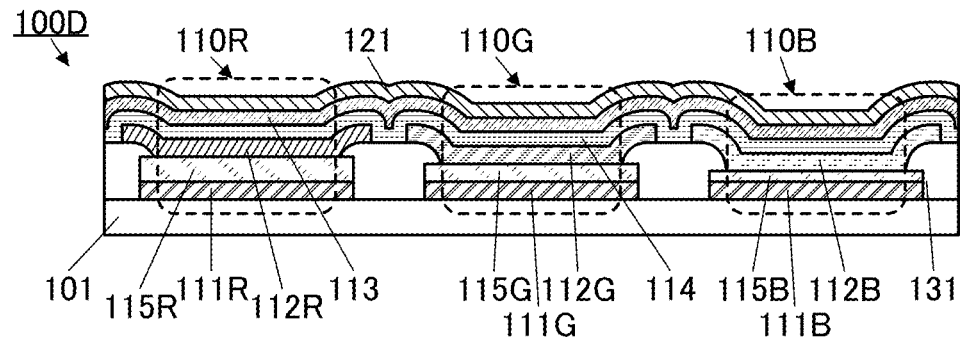
FIG. 9A to FIG. 9C are diagrams each illustrating a structure example of a display device.
Figure 9B:
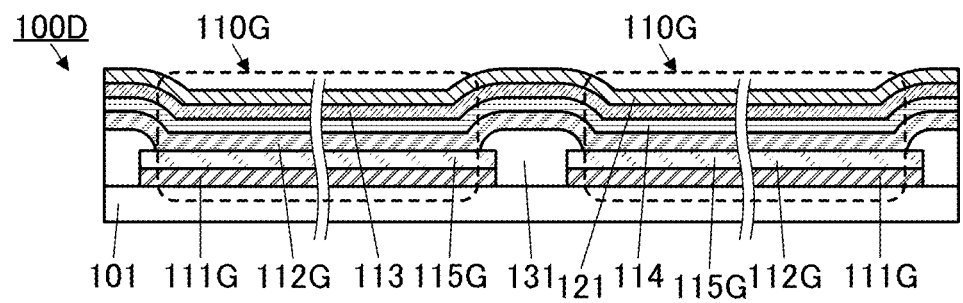

A display device 100D illustrated in FIG. 9A and FIG. 9B is different from the display device 100 mainly in the structure of the light-emitting element.

The light-emitting element 110R includes an optical adjustment layer 115R between the pixel electrode 111R and the EL layer 112R. The light-emitting element 110G includes an optical adjustment layer 115G between the pixel electrode 111G and the EL layer 112G. The light-emitting element 110B includes an optical adjustment layer 115B between the pixel electrode 111B and the EL layer 112B.

In addition, the optical adjustment layer 115R, the optical adjustment layer 115G, and the optical adjustment layer 115B each have a light-transmitting property with respect to visible light. The optical adjustment layer 115R, the optical adjustment layer 115G, and the optical adjustment layer 115B have different thicknesses from each other. Thus, the optical path lengths of the light-emitting elements can differ from one another.

Here, a conductive film that has a reflective property with respect to visible light is used for the pixel electrode 111R, the pixel electrode 111G, and the pixel electrode 111B, and a conductive film that has properties of reflecting and transmitting visible light is used for the common electrode 113. This enables the light-emitting elements to have what is called a microcavity structure and to intensify light with a certain wavelength. Thus, a display device with improved color purity can be achieved.

A conductive material having a light-transmitting property with respect to visible light can be used for each of the optical adjustment layers. For example, a conductive oxide such as indium oxide, indium tin oxide, indium zinc oxide, zinc oxide, zinc oxide containing gallium, indium tin oxide containing silicon, or indium zinc oxide containing silicon can be used.

The optical adjustment layers can be formed after the formation of the pixel electrode 111R, the pixel electrode 111G, and the pixel electrode 111B and before the formation of the EL film 112Rf or the like. The optical adjustment layers may be formed using conductive films with different thicknesses from each other or may have a single-layer structure, a two-layer structure, a three-layer structure, or the like in the order of small thickness.

Figure 9C:
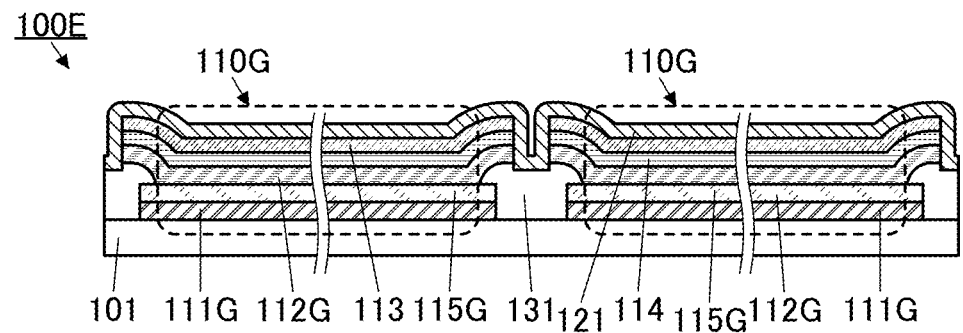

A display device 100E illustrated in FIG. 9C is an example of a case where an optical adjustment layer is included in the display device 100A. FIG. 9C is a cross section of the two light-emitting elements 110G arranged side by side in the Y direction.

Modification Example 3

Figure 10A:
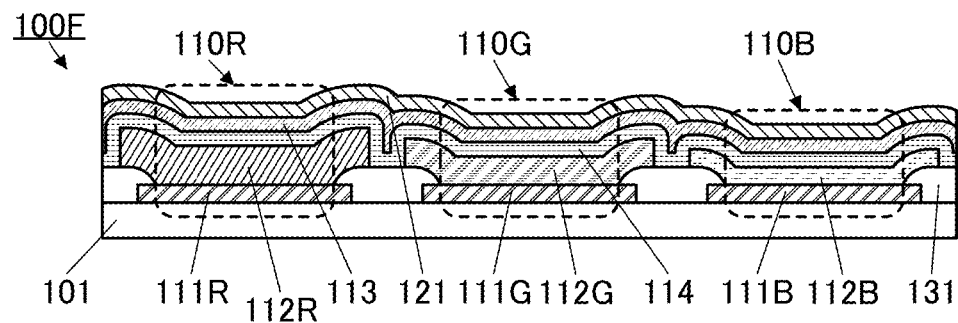
FIG. 10A to FIG. 10C are diagrams each illustrating a structure example of a display device.
Figure 10B:
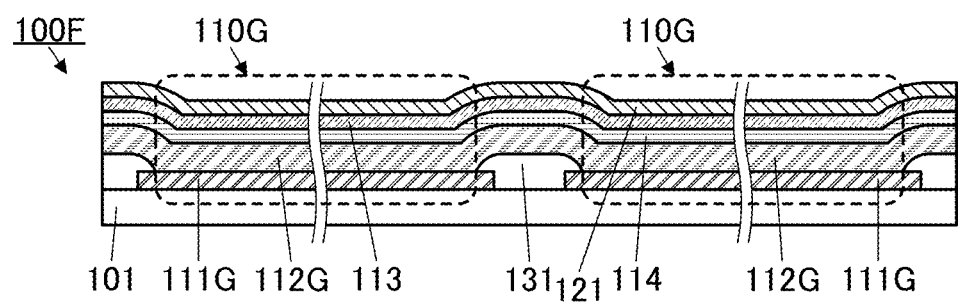

A display device 100F illustrated in FIG. 10A and FIG. 10B is different from the display device 100D mainly in not including an optical adjustment layer.

The display device 100F is an example where a microcavity structure is achieved with the thicknesses of the EL layer 112R, the EL layer 112G, and the EL layer 112B. Such a structure does not require an optical adjustment layer provided additionally, whereby the process can be simplified.

For example, in the display device 100C, the EL layer 112R of the light-emitting element 110R emitting light whose wavelength is the longest has the largest thickness, and the EL layer 112B of the light-emitting element 110B emitting light whose wavelength is the shortest has the smallest thickness. Note that without limitation to this, the thickness of each EL layer can be adjusted in consideration of the wavelength of light emitted by the light-emitting element, the optical characteristics of the layer included in the light-emitting element, the electrical characteristics of the light-emitting element, and the like.

Figure 10C:
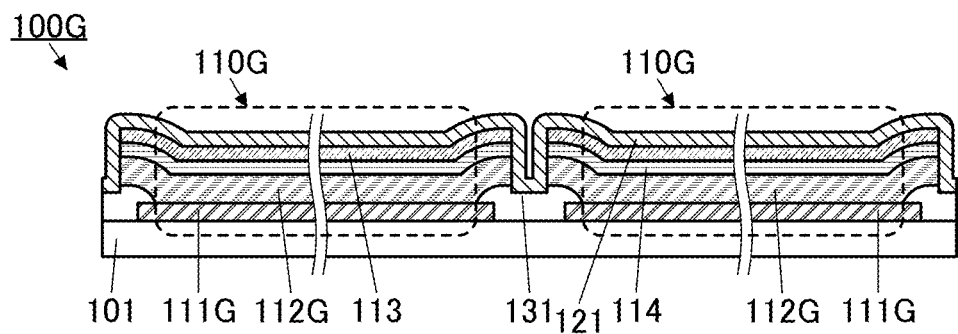

A display device 100G illustrated in FIG. 10C is an example where a microcavity structure is achieved by changing the thicknesses of the EL layers of the display device 100A. FIG. 10C is a cross section of two light-emitting elements 110G arranged side by side in the Y direction.

The above is the description of the modification examples.

Note that although the example of using the EL layer 114 is described in Modification example 2 and Modification example 3 which are described above, the structure may be employed in which the EL layer 114 is not provided.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 2

In this embodiment, structure examples of a display device of one embodiment of the present invention will be described.

The display device of this embodiment can be a high-definition display device or large-sized display device. Accordingly, the display device of this embodiment can be used for display portions of electronic devices such as a digital camera, a digital video camera, a digital photo frame, a mobile phone, a portable game console, a smartphone, a watch-type terminal, a tablet terminal, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Device 400A]

Figure 11:
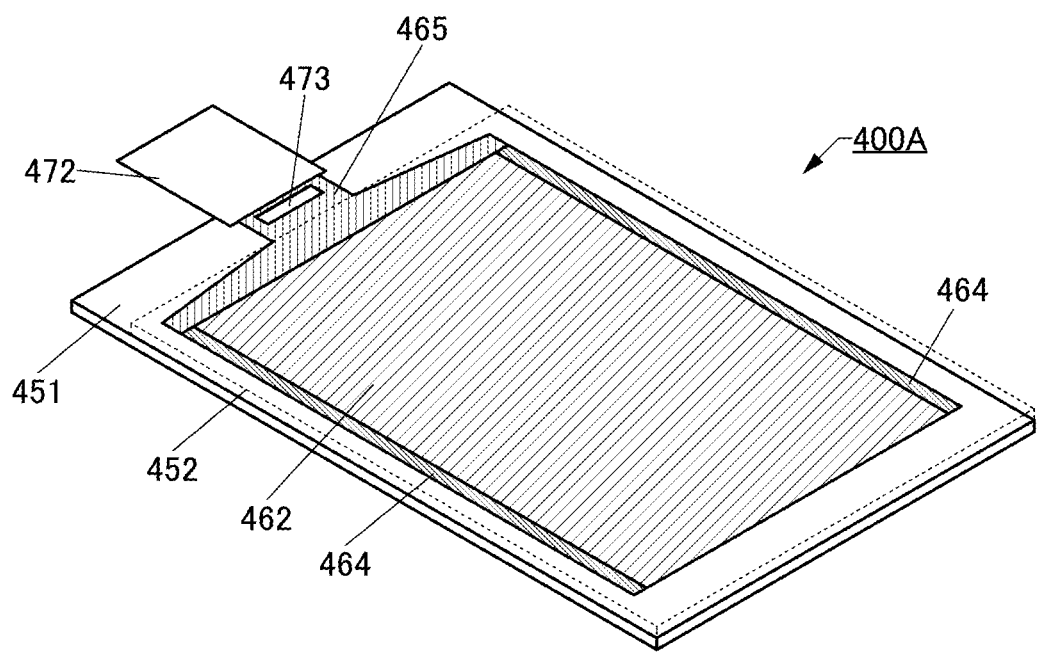
FIG. 11 is a perspective view illustrating an example of a display device.

FIG. 11 illustrates a perspective view of a display device 400A, and FIG. 12A illustrates a cross-sectional view of the display device 400A.

The display device 400A has a structure in which a substrate 452 and a substrate 451 are bonded to each other. In FIG. 11, the substrate 452 is denoted by a dashed line.

The display device 400A includes a display portion 462, a circuit 464, a wiring 465, and the like. FIG. 11 illustrates an example where an IC 473 and an FPC 472 are mounted on the display device 400A. Thus, the structure illustrated in FIG. 11 can be regarded as a display module including the display device 400A, the IC (integrated circuit), and the FPC.

As the circuit 464, for example, a scan line driver circuit can be used.

The wiring 465 has a function of supplying a signal and power to the display portion 462 and the circuit 464. The signal and power are input to the wiring 465 from the outside through the FPC 472 or input to the wiring 465 from the IC 473.

FIG. 11 illustrates an example in which the IC 473 is provided over the substrate 451 by a COG (Chip On Glass) method, a COF (Chip on Film) method, or the like. An IC including a scan line driver circuit, a signal line driver circuit, or the like can be used as the IC 473, for example. Note that the display device 400A and the display module are not necessarily provided with an IC. The IC may be mounted on the FPC by a COF method or the like.

FIG. 12A illustrates an example of cross sections of part of a region including the FPC 472, part of the circuit 464, part of the display portion 462, and part of a region including an end portion of the display device 400A.

The display device 400A illustrated in FIG. 12A includes a transistor 201, a transistor 205, a light-emitting element 430a that emits red light, a light-emitting element 430b that emits green light, a light-emitting element 430c that emits blue light, and the like between the substrate 451 and the substrate 452.

The light-emitting element described in Embodiment 1 can be employed for the light-emitting element 430a, the light-emitting element 430b, and the light-emitting element 430c.

In the case where a pixel of the display device includes three kinds of subpixels including light-emitting elements emitting different colors from each other, the three subpixels can be of three colors of R, G, and B or of three colors of yellow (Y), cyan (C), and magenta (M). In the case where four subpixels are included, the four subpixels can be of four colors of R, G, B, and white (W) or of four colors of R, G, B, and Y.

A protective layer 416 and the substrate 452 are bonded to each other with an adhesive layer 442. A solid sealing structure, a hollow sealing structure, or the like can be employed to seal the light-emitting elements. In FIG. 12A, a space 443 surrounded by the substrate 452, the adhesive layer 442, and the substrate 451 is filled with an inert gas (e.g., nitrogen or argon), that is, a hollow sealing structure is employed. The adhesive layer 442 may be provided so as to overlap with the light-emitting element. The space 443 surrounded with the substrate 452, the adhesive layer 442, and the substrate 451 may be filled with a resin different from that of the adhesive layer 442.

The light-emitting elements 430a, 430b, and 430c each include an optical adjustment layer between the pixel electrode and the EL layer. The light-emitting element 430a includes an optical adjustment layer 426a, the light-emitting element 430b includes an optical adjustment layer 426b, and the light-emitting element 430c includes an optical adjustment layer 426c. Embodiment 1 can be referred to for the details of the light-emitting elements.

Pixel electrodes 411a, 411b, and 411c are each connected to a conductive layer 222b included in the transistor 205 through an opening provided in an insulating layer 214.

End portions of the pixel electrode and the optical adjustment layer are covered with an insulating layer 421. The pixel electrode contains a material that reflects visible light, and the common electrode contains a material that transmits visible light.

Light emitted from the light-emitting element is emitted toward the substrate 452 side. For the substrate 452, a material having a high transmitting property with respect to visible light is preferably used.

The transistor 201 and the transistor 205 are formed over the substrate 451. These transistors can be formed using the same materials in the same steps.

An insulating layer 211, an insulating layer 213, an insulating layer 215, and the insulating layer 214 are provided in this order over the substrate 451. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This allows the insulating layer to serve as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Thus, the organic insulating film preferably has an opening in the vicinity of an end portion of the display device 400A. This can inhibit entry of impurities from the end portion of the display device 400A through the organic insulating film. Alternatively, the organic insulating film may be formed so that an end portion of the organic insulating film is positioned on the inner side compared to the end portion of the display device 400A, to prevent the organic insulating film from being exposed at the end portion of the display device 400A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 12A, an opening is formed in the insulating layer 214. This can inhibit entry of impurities into the display portion 462 from the outside through the insulating layer 214 even when an organic insulating film is used as the insulating layer 214. Thus, the reliability of the display device 400A can be increased.

Each of the transistor 201 and the transistor 205 includes a conductive layer 221 functioning as a gate, the insulating layer 211 functioning as a gate insulating layer, a conductive layer 222a and a conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 201 and the transistor 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

A semiconductor layer of a transistor preferably includes a metal oxide (also referred to as an oxide semiconductor). That is, a transistor including a metal oxide in its channel formation region (hereinafter, also referred to as an OS transistor) is preferably used for the display device of this embodiment. Alternatively, the semiconductor layer of the transistor may include silicon. Examples of silicon include amorphous silicon and crystalline silicon (e.g., low-temperature polysilicon and single crystal silicon).

The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

Note that when the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where Ga is greater than 0.1 and less than or equal to 2 and Zn is greater than or equal to 5 and less than or equal to 7 with In being 5. When the atomic ratio is described as In:Ga:Zn=1:1:1 or a composition in the neighborhood thereof, the case is included where Ga is greater than 0.1 and less than or equal to 2 and Zn is greater than 0.1 and less than or equal to 2 with In being 1.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A connection portion 204 is provided in a region of the substrate 451 that does not overlap with the substrate 452. In the connection portion 204, the wiring 465 is electrically connected to the FPC 472 through a conductive layer 466 and a connection layer 242. An example is illustrated in which the conductive layer 466 has a stacked-layer structure of a conductive film obtained by processing the same conductive film as the pixel electrode and a conductive film obtained by processing the same conductive film as the optical adjustment layer. On the top surface of the connection portion 204, the conductive layer 466 is exposed. Thus, the connection portion 204 and the FPC 472 can be electrically connected to each other through the connection layer 242.

A light-blocking layer 417 is preferably provided on a surface of the substrate 452 on the substrate 451 side. Any of a variety of optical members can be arranged on the outer side of the substrate 452. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorbing layer, or the like may be provided on the outer side of the substrate 452.

With the protective layer 416 covering the light-emitting element, entry of impurities such as water or the like into the light-emitting element can be inhibited, leading to an increase in the reliability of the light-emitting element.

In the region 228 in the vicinity of the end portion of the display device 400A, the insulating layer 215 and the protective layer 416 are preferably in contact with each other through the opening in the insulating layer 214. In particular, the inorganic insulating film included in the insulating layer 215 and the inorganic insulating film included in the protective layer 416 are preferably in contact with each other. Thus, entry of impurities into the display portion 462 from the outside through an organic insulating film can be inhibited. As a result, the reliability of the display device 400A can be increased.

FIG. 12B illustrates an example where the protective layer 416 has a three-layer structure. In FIG. 12B, the protective layer 416 includes an inorganic insulating layer 416a over the light-emitting element 430c, an organic insulating layer 416b over the inorganic insulating layer 416a, and an inorganic insulating layer 416c over the organic insulating layer 416b.

An end portion of the inorganic insulating layer 416a and an end portion of the inorganic insulating layer 416c extend beyond an end portion of the organic insulating layer 416b and are in contact with each other. The inorganic insulating layer 416a is in contact with the insulating layer 215 (inorganic insulating layer) through the opening in the insulating layer 214 (organic insulating layer). Thus, the light-emitting element can be surrounded by the insulating layer 215 and the protective layer 416, so that the reliability of the light-emitting element can be increased.

As described above, the protective layer 416 may have a stacked-layer structure of an organic insulating film and an inorganic insulating film. In that case, an end portion of the inorganic insulating film preferably extends beyond an end portion of the organic insulating film.

For each of the substrate 451 and the substrate 452, glass, quartz, ceramics, sapphire, a resin, a metal, an alloy, a semiconductor, or the like can be used. For the substrate on the side where light from the light-emitting element is extracted, a material that transmits the light is used. When a flexible material is used for the substrate 451 and the substrate 452, the flexibility of the display device can be increased. Furthermore, a polarizing plate may be used as the substrate 451 or the substrate 452.

For each of the substrate 451 and the substrate 452, it is possible to use a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like. Glass that is thin enough to have flexibility may be used for one or both of the substrate 451 and the substrate 452.

In the case where a circularly polarizing plate overlaps with the display device, a highly optically isotropic substrate is preferably used as the substrate included in the display device. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer, a variety of curable adhesives, e.g., a photocurable adhesive such as an ultraviolet curable adhesive, a reactive curable adhesive, a thermosetting adhesive, or an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer 242, an anisotropic conductive film (ACF), an anisotropic conductive paste (ACP), or the like can be used.

Examples of materials that can be used for a gate, a source, and a drain of a transistor and conductive layers such as a variety of wirings and electrodes included in a display device include metals such as aluminum, titanium, chromium, nickel, copper, yttrium, zirconium, molybdenum, silver, tantalum, or tungsten, and an alloy containing any of these metals as its main component. A film containing any of these materials can be used as a single layer or stacked-layer structure.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to be able to transmit light. A stacked film of any of the above materials can be used as a conductive layer. For example, a stacked film of indium tin oxide and an alloy of silver and magnesium is preferably used, in which case the conductivity can be increased. These can also be used, for example, for conductive layers such as a variety of wirings and electrodes included in the display device, or conductive layers (e.g., a conductive layer functioning as a pixel electrode or a common electrode) included in the light-emitting element.

Examples of insulating materials that can be used for the insulating layers include a resin such as an acrylic resin and an epoxy resin, and an inorganic insulating material such as silicon oxide, silicon oxynitride, silicon nitride oxide, silicon nitride, and aluminum oxide.

[Display Device 400B]

Figure 13A:
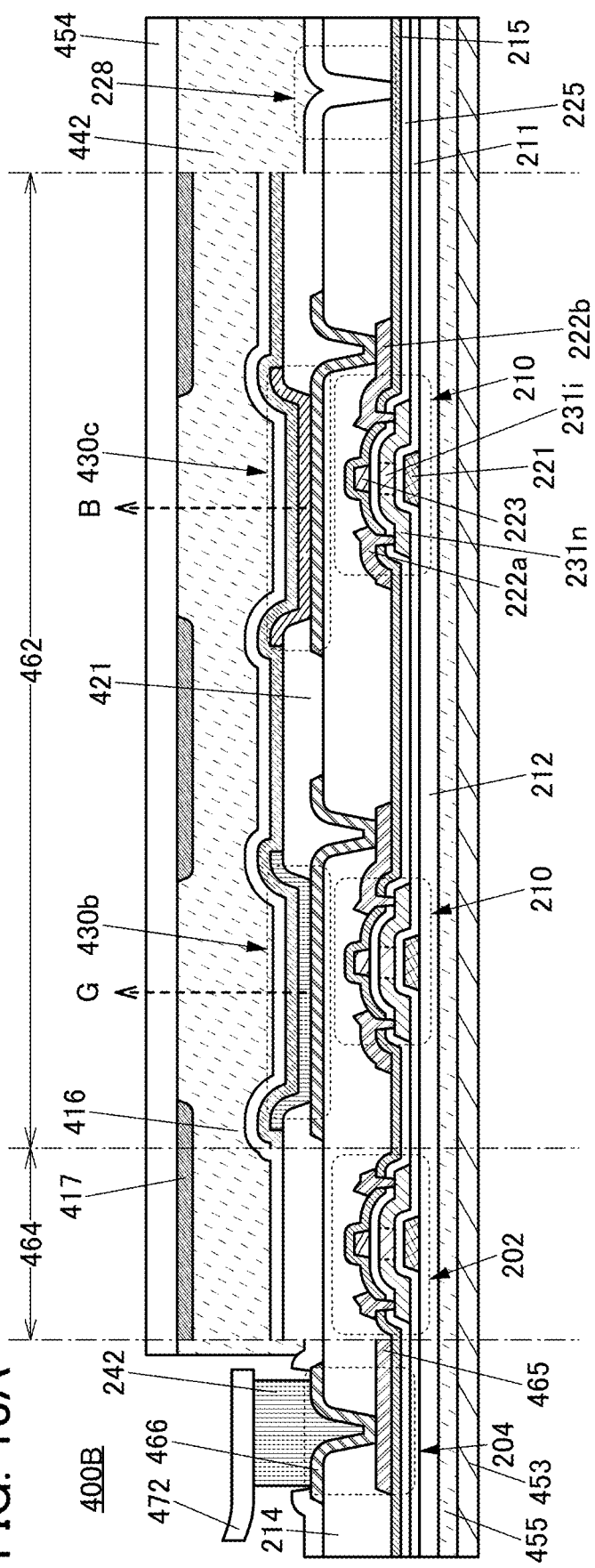
FIG. 13A is a cross-sectional view illustrating an example of a display device.

FIG. 13A is a cross-sectional view of a display device 400B. A perspective view of the display device 400B is similar to that of the display device 400A (FIG. 11). FIG. 13A illustrates an example of cross sections of part of a region including the FPC 472, part of the circuit 464, and part of the display portion 462 of the display device 400B. FIG. 13A specifically illustrates an example of a cross section of a region including the light-emitting element 430b that emits green light and the light-emitting element 430c that emits blue light of the display portion 462. Note that portions similar to those of the display device 400A are not described in some cases.

The display device 400B illustrated in FIG. 13A includes a transistor 202, a transistor 210, the light-emitting element 430b, the light-emitting element 430c, and the like between a substrate 453 and a substrate 454.

The substrate 454 and the protective layer 416 are bonded to each other with the adhesive layer 442. The adhesive layer 442 is provided so as to overlap with each of the light-emitting element 430b and the light-emitting element 430c, and the display device 400B employs a solid sealing structure.

The substrate 453 and an insulating layer 212 are bonded to each other with an adhesive layer 455.

In a method for manufacturing the display device 400B, first, a formation substrate provided with the insulating layer 212, the transistors, the light-emitting elements, and the like is bonded to the substrate 454 provided with the light-blocking layer 417 with the adhesive layer 442. Then, the substrate 453 is bonded to a surface exposed by separation of the formation substrate, whereby the components formed over the formation substrate are transferred onto the substrate 453. The substrate 453 and the substrate 454 preferably have flexibility. This can increase the flexibility of the display device 400B.

The inorganic insulating film that can be used as the insulating layer 211, the insulating layer 213, and the insulating layer 215 can be used as the insulating layer 212.

The pixel electrode is connected to the conductive layer 222b included in the transistor 210 through the opening provided in the insulating layer 214. The conductive layer 222b is connected to a low-resistance region 231n through an opening provided in the insulating layer 215 and an insulating layer 225. The transistor 210 has a function of controlling the driving of the light-emitting element.

An end portion of the pixel electrode is covered with the insulating layer 421.

Light emitted by the light-emitting elements 430b and 430c is emitted toward the substrate 454 side. For the substrate 454, a material having a high transmitting property with respect to visible light is preferably used.

The connection portion 204 is provided in a region of the substrate 453 that does not overlap with the substrate 454. In the connection portion 204, the wiring 465 is electrically connected to the FPC 472 through the conductive layer 466 and the connection layer 242. The conductive layer 466 can be obtained by processing the same conductive film as the pixel electrode. Thus, the connection portion 204 and the FPC 472 can be electrically connected to each other through the connection layer 242.

The transistor 202 and the transistor 210 each include the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance regions 231n, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the corresponding low-resistance regions 231n through openings provided in the insulating layer 215. One of the conductive layer 222a and the conductive layer 222b functions as a source, and the other functions as a drain.

FIG. 13A illustrates an example in which the insulating layer 225 covers the top surface and a side surface of the semiconductor layer. The conductive layer 222a and the conductive layer 222b are connected to the corresponding low-resistance regions 231n through openings provided in the insulating layer 225 and the insulating layer 215.

Figure 13B:
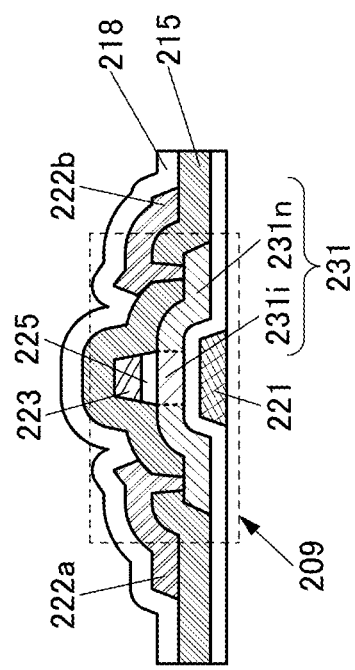
FIG. 13B is a cross-sectional view illustrating an example of a transistor.

In a transistor 209 illustrated in FIG. 13B, the insulating layer 225 overlaps with the channel formation region 231i of the semiconductor layer 231 and does not overlap with the low-resistance regions 231n. The structure illustrated in FIG. 13B can be manufactured by processing the insulating layer 225 using the conductive layer 223 as a mask, for example. In FIG. 13B, the insulating layer 215 is provided to cover the insulating layer 225 and the conductive layer 223, and the conductive layer 222a and the conductive layer 222b are connected to the low-resistance regions 231n through the openings in the insulating layer 215. Furthermore, an insulating layer 218 covering the transistor may be provided.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 3

In this embodiment, light-emitting elements (also referred to as light-emitting devices) that can be used in a display device that is one embodiment of the present invention will be described.

In this specification and the like, a device formed using a metal mask or an FMM (fine metal mask, high-resolution metal mask) may be referred to as a device having an MM (metal mask) structure. In this specification and the like, a device formed without using a metal mask or an FMM may be referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display device.

Structures of light-emitting devices can be classified roughly into a single structure and a tandem structure. A device with a single structure includes one light-emitting unit between a pair of electrodes, and the light-emitting unit preferably includes one or more light-emitting layers. To obtain white light emission, two or more light-emitting layers are selected such that emission colors of the light-emitting layers are complementary colors. For example, when emission colors of a first light-emitting layer and a second light-emitting layer are complementary colors, the light-emitting device can be configured to emit white light as a whole. The same applies to a light-emitting device including three or more light-emitting layers.

A device with a tandem structure includes two or more light-emitting units between a pair of electrodes, and each light-emitting unit preferably includes one or more light-emitting layers. To obtain white light emission, the structure is made so that light from light-emitting layers of the plurality of light-emitting units can be combined to be white light. Note that a structure for obtaining white light emission is similar to a structure in the case of a single structure. In the device with a tandem structure, an intermediate layer such as a charge-generation layer is suitably provided between the plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

Structure Example of Light-Emitting Element

Figure 14A:
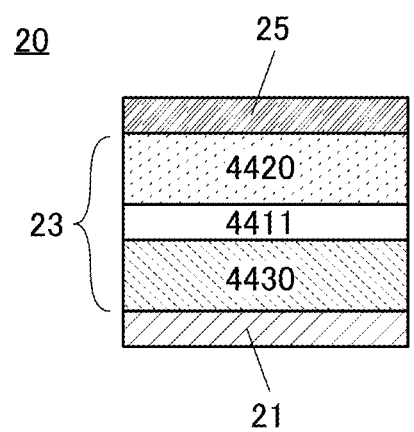
FIG. 14A to FIG. 14D are diagrams illustrating structure examples of a light-emitting element.

As shown in FIG. 14A, the light-emitting element includes an EL layer 23 between a pair of electrodes (a lower electrode 21 and an upper electrode 25). The EL layer 23 can be formed of a plurality of layers, e.g., a layer 4420, a light-emitting layer 4411, and a layer 4430. The layer 4420 can include, for example, a layer containing a substance with a high electron-injection property (electron-injection layer) and a layer containing a substance with a high electron-transport property (electron-transport layer). The light-emitting layer 4411 contains a light-emitting compound, for example. The layer 4430 can include, for example, a layer containing a substance with a high hole-injection property (hole-injection layer) and a layer containing a substance with a high hole-transport property (hole-transport layer).

The structure including the layer 4420, the light-emitting layer 4411, and the layer 4430, which are provided between a pair of electrodes, can serve as a single light-emitting unit, and the structure in FIG. 14A is referred to as a single structure in this specification.

Figure 14B:
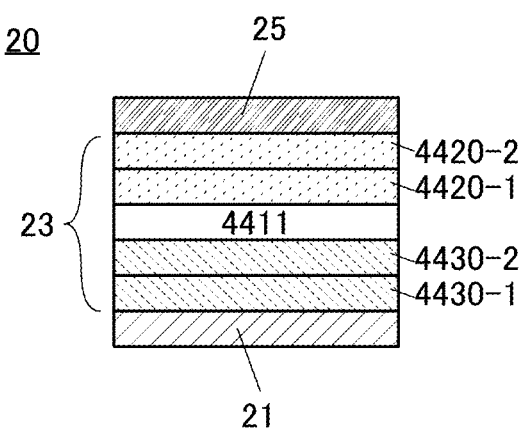

FIG. 14B is a modification example of the EL layer 23 included in the light-emitting element 20 illustrated in FIG. 14A. Specifically, the light-emitting element 20 illustrated in FIG. 14B includes a layer 4430-1 over the lower electrode 21, a layer 4430-2 over the layer 4430-1, the light-emitting layer 4411 over the layer 4430-2, a layer 4420-1 over the light-emitting layer 4411, a layer 4420-2 over the layer 4420-1, and the upper electrode 25 over the layer 4420-2. For example, when the lower electrode 21 functions as an anode and the upper electrode 25 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the lower electrode 21 functions as a cathode and the upper electrode 25 functions as an anode, the layer 4430-1 functions as an electron-injection layer, the layer 4430-2 functions as an electron-transport layer, the layer 4420-1 functions as a hole-transport layer, and the layer 4420-2 functions as the hole-injection layer. With such a layer structure, carriers can be efficiently injected to the light-emitting layer 4411, and the efficiency of the recombination of carriers in the light-emitting layer 4411 can be enhanced.

Figure 14C:
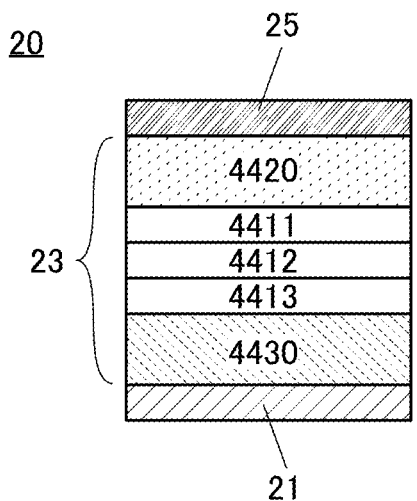

Note that the structure in which a plurality of light-emitting layers (light-emitting layers 4411, 4412, and 4413) is provided between the layer 4420 and the layer 4430 as illustrated in FIG. 14C is another variation of the single structure.

Figure 14D:
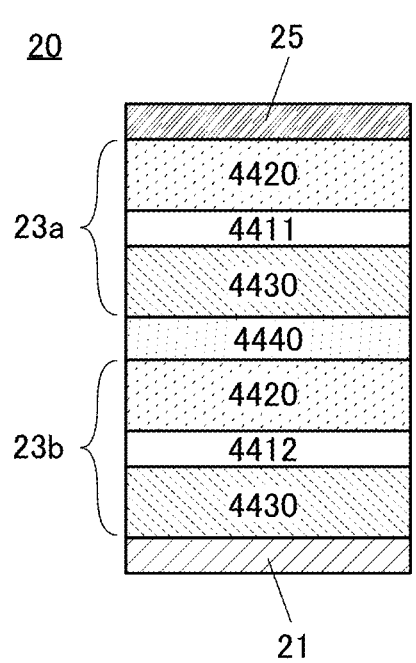

The structure in which a plurality of light-emitting units (EL layers 23a and 23b) are connected in series with an intermediate layer (charge-generation layer) 4440 therebetween as illustrated in FIG. 14D is referred to as a tandem structure in this specification. In this specification and the like, the structure illustrated in FIG. 14D is referred to as a tandem structure; however, without being limited to this, a tandem structure may be referred to as a stack structure, for example. The tandem structure enables a light-emitting element to emit light at high luminance.

In FIG. 14C and FIG. 14D, the layer 4420 and the layer 4430 may each have a stacked-layer structure of two or more layers as in FIG. 14B.

The emission color of the light-emitting element can be red, green, blue, cyan, magenta, yellow, white, or the like depending on the material that constitutes the EL layer 23. Furthermore, the color purity can be further increased when the light-emitting element has a microcavity structure.

The light-emitting element that emits white light preferably contains two or more kinds of light-emitting substances in the light-emitting layer. To obtain white light emission, two or more kinds of light-emitting substances are selected such that their emission colors are complementary. For example, when the emission color of a first light-emitting layer and the emission color of a second light-emitting layer have a relationship of complementary colors, it is possible to obtain the light-emitting element which emits white light as a whole. This can be applied to a light-emitting element including three or more light-emitting layers.

The light-emitting layer preferably contains two or more of light-emitting substances that emit light of R (red), G (green), B (blue), Y (yellow), O (orange), and the like. Alternatively, the light-emitting layer preferably contains two or more light-emitting substances that emit light containing two or more of color spectral components of R, G, and B.

Here, a specific structure example of the light emitting element will be described.

The light-emitting element includes at least a light-emitting layer. The light-emitting element may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, a substance with a bipolar property (a substance with a high electron- and hole-transport property), or the like.

Either a low molecular compound or a high molecular compound can be used for the light-emitting devices, and an inorganic compound may also be included. Each of the layers included in the light-emitting devices can be formed by an evaporation method (including a vacuum evaporation method), a transfer method, a printing method, an inkjet method, a coating method, or the like.

For example, the light-emitting device can include one or more of a hole-injection layer, a hole-transport layer, a hole-blocking layer, an electron-blocking layer, an electron-transport layer, and an electron-injection layer in addition to the light-emitting layer.

The hole-injection layer is a layer injecting holes from an anode to the hole-transport layer, and a layer containing a material with a high hole-injection property. As the material with a high hole-injection property, an aromatic amine compound and a composite material containing a hole-transport material and an acceptor material (electron-accepting material) can be used, for example.

The hole-transport layer is a layer transporting holes, which are injected from the anode by the hole-injection layer, to the light-emitting layer. The hole-transport layer is a layer containing a hole-transport material. As the hole-transport material, a substance having a hole mobility greater than or equal to $1 \times 10^{-6}$ cm$^2$/Vs is preferable. Note that other substances can also be used as long as they have a property of transporting more holes than electrons. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-transport layer is a layer that transports electrons, which are injected from a cathode by the electron-injection layer, to the light-emitting layer. The electron-transport layer is a layer containing an electron-transport material. As the electron-transport material, a substance with an electron mobility greater than or equal to $1 \times 10^{6}$ cm$^2$/Vs is preferable. Note that other substances can also be used as long as they have a property of transporting more electrons than holes. As the electron-transport material, it is possible to use a material with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from a cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The electron-injection layer can be formed using an alkali metal, an alkaline earth metal, or a compound thereof, such as lithium, cesium, lithium fluoride (LiF), cesium fluoride (CsF), calcium fluoride (CaF$_2$), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide (LiO$_x$), or cesium carbonate, for example.

Alternatively, a material with an electron-transport property may be used for the electron-injection layer. For example, a compound having an unshared electron pair and an electron deficient heteroaromatic ring can be used as the material having an electron-transport property. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

The light-emitting layer is a layer containing a light-emitting substance. The light-emitting layer can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting device can be achieved at the same time.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 4

In this embodiment, a high-resolution display device will be described.

Structure Example of Display Panel

Wearable electronic devices for VR, AR, and the like can provide 3D images by using parallax. In that case, it is necessary to display an image for the right eye in the right eye's field of view and display an image for the left eye in the left eye's field of view. Although the shape of a display portion in a display device may be a horizontal rectangular shape, pixels provided outside the field of view of the right eye and the left eye do not contribute to display, and thus black is always displayed in these pixels.

In view of the above, it is preferable that a display portion of a display panel be divided into two regions for the right eye and for the left eye, and that pixels not be arranged in an outer region which does not contribute to display. Hence, power consumption needed for writing to pixels can be reduced. Moreover, loads on source lines, gate lines, and the like are reduced, so that display with a high frame rate is possible. Consequently, smooth moving images can be displayed, which improves realistic sensation.

Figure 15A:
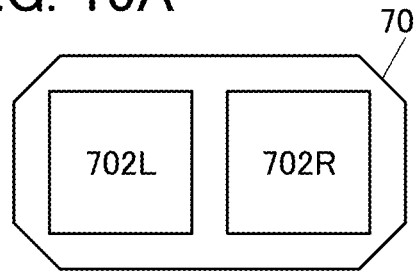
FIG. 15A to FIG. 15J are diagrams illustrating structure examples of a display device.
Figure 15B:
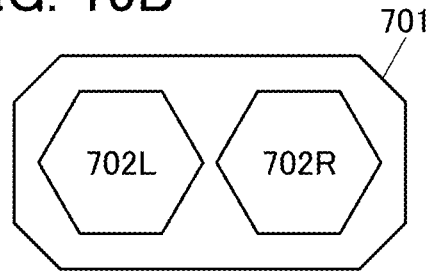

FIG. 15A illustrates a structure example of a display panel. In FIG. 15A, a display portion 702L for the left eye and a display portion 702R for the right eye are placed inner side of a substrate 701. Note that in addition to the display portion 702L and the display portion 702R, a driver circuit, a wiring, an IC, an FPC, or the like may be placed over the substrate 701.

The display portion 702L and the display portion 702R illustrated in FIG. 15A each have a square top surface shape.

The top surface shapes of the display portion 702L and the display portion 702R may be other regular polygons. FIG. 15B, FIG. 15C, FIG. 15D, and FIG. 15E illustrate examples in which the top surface shapes are a regular hexagon, a regular octagon, a regular decagon, and a regular dodecagon, respectively. When a polygon with even-numbered corners is used as above, the shape of the display portion can be bilaterally symmetrical. Note that Note that a polygon that is not a regular polygon may be used. Moreover, a regular polygon or a polygon with rounded corners may be used.

Since the display portion consists of pixels arranged in a matrix, a straight line portion of the outline of the display portion is not strictly a straight line and can be partly a stair-like portion. Specifically, a straight line portion that is not parallel to the direction of pixel arrangement has a stair-like top surface shape. Since the user sees images without perceiving the shape of the pixels, a tilted outline, which is stair-like to be exact, of the display portion can be regarded as a straight line. Similarly, a curved portion, which is stair-like to be exact, of the outline of the display portion can be regarded as a curve.

Figure 15C:
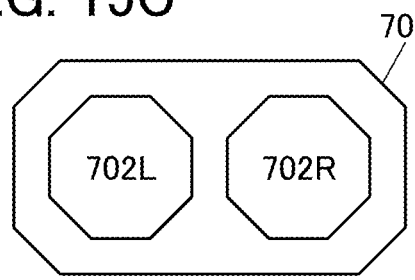
Figure 15D:
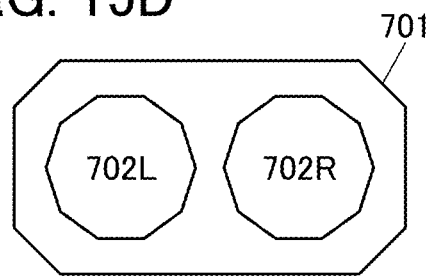
Figure 15E:
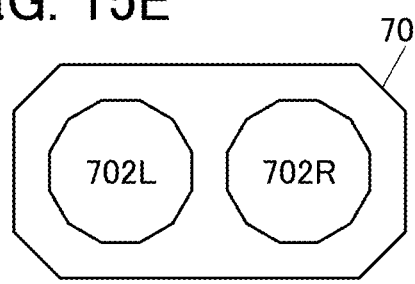
Figure 15F:
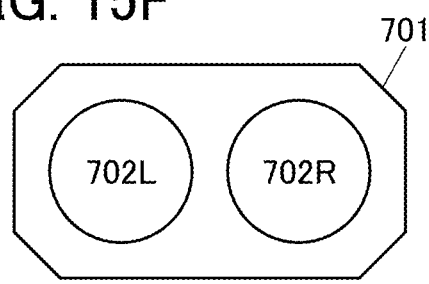

FIG. 15F illustrates an example in which the top surface shapes of the display portion 702L and the display portion 702R are circular.

The top surface shapes of the display portion 702L and the display portion 702R may be bilaterally asymmetrical. Moreover, they are not necessarily regular polygonal.

Figure 15G:
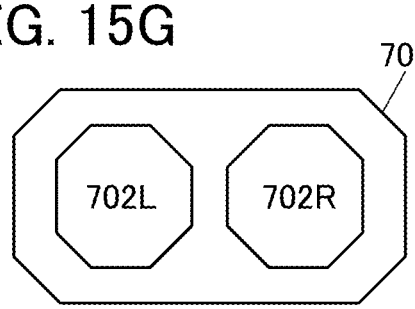
Figure 15H:
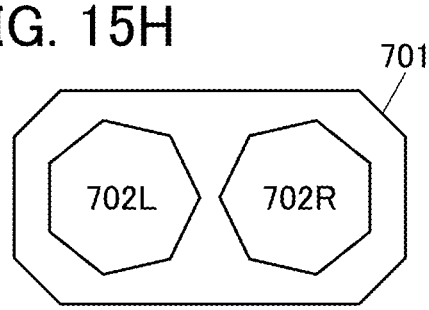

FIG. 15G illustrates an example in which the top surface shapes of the display portion 702L and the display portion 702R are bilaterally asymmetric octagonal. FIG. 15H illustrates an example in which the top surface shapes are regular heptagonal. Even when the top surface shapes of the display portion 702L and the display portion 702R have a bilaterally asymmetrical shape in this manner, the display portion 702L and the display portion 702R are preferably placed bilaterally symmetrically. Consequently, an image with no unnaturalness can be provided.

Although the structures where the display portion is divided into two are described above, the display portions may have a continuous shape.

Figure 15I:
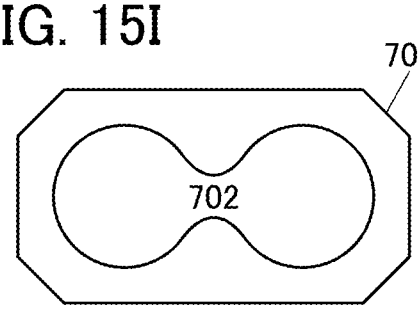
Figure 15J:
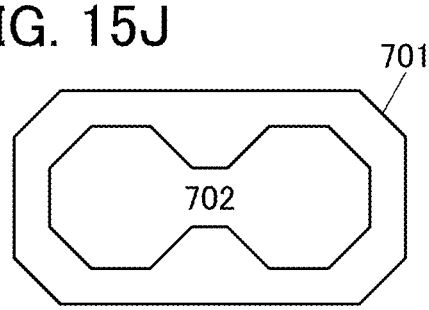

FIG. 15I is an example in which the two circular display portions in FIG. 15F are connected to each other. FIG. 15J is an example in which the two regular octagonal display portions in FIG. 15C are connected to each other.

The above is the description of the structure examples of the display panel.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 5

In this embodiment, a metal oxide (also referred to as an oxide semiconductor) that can be used in the OS transistor described in the above embodiment will be described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structures>

Amorphous (including a completely amorphous structure), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum obtained by GIXD (Grazing-Incidence XRD) measurement. Note that a GIXD method is also referred to as a thin film method or a Seemann-Bohlin method.

For example, the XRD spectrum of a quartz glass substrate shows a peak with a substantially bilaterally symmetrical shape. On the other hand, the peak of the XRD spectrum of an IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction method (NBED) (such a pattern is also referred to as a nanobeam electron diffraction pattern). For example, a halo pattern is observed in the diffraction pattern of the quartz glass substrate, which indicates that the quartz glass is in an amorphous state. Furthermore, not a halo pattern but a spot-like pattern is observed in the diffraction pattern of the IGZO film formed at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the one described above when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions described above is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction described above, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Hence, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., greater than or equal to 1 nm and less than or equal to 30 nm).

[A-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has a higher hydrogen concentration in the film than the nc-OS and the CAAC-OS.

<<Composition of Oxide Semiconductor>>

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

The second region has a higher insulating property than the first region. In other words, when the second regions are distributed in a metal oxide, leakage current can be inhibited.

Thus, in the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility ($\mu$), and excellent switching operation can be achieved.

A transistor using a CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Accordingly, a transistor including an oxide semiconductor containing an alkali metal or an alkaline earth metal is likely to have normally-on characteristics. Thus, the concentration of an alkali metal or an alkaline earth metal in the oxide semiconductor, which is obtained by SIMS, is set lower than or equal to $1 \times 10^{18}$ atoms/cm$^3$, preferably lower than or equal to $2 \times 10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor including an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor including an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 6

In this embodiment, electronic devices of one embodiment of the present invention will be described with reference to FIG. 16 to FIG. 19.

An electronic device of this embodiment includes the display device of one embodiment of the present invention. Resolution, definition, and sizes of the display device of one embodiment of the present invention are easily increased. Thus, the display device of one embodiment of the present invention can be used for display portions of a variety of electronic devices.

The display device of one embodiment of the present invention can be manufactured at low cost, which leads to a reduction in manufacturing cost of an electronic device.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

In particular, a display device of one embodiment of the present invention can have a high resolution, and thus can be favorably used for an electronic device having a relatively small display portion. As such an electronic device, a watch-type or bracelet-type information terminal device (wearable device); and a wearable device worn on a head, such as a device for VR such as a head mounted display and a glasses-type device for AR can be given, for example. Examples of wearable devices include a device for SR and a device for MR.

The resolution of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, resolution of 4K2K, 8K4K, or higher is preferable. Furthermore, the pixel density (definition) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With such a display device with high resolution and high definition, the electronic device can have higher realistic sensation, sense of depth, and the like in personal use such as portable use and home use.

The electronic device of this embodiment can be incorporated along a curved surface of an inside wall or an outside wall of a house or a building or the interior or the exterior of a car.

The electronic device of this embodiment may include an antenna. With the antenna receiving a signal, the electronic device can display an image, information, and the like on a display portion. When the electronic device includes the antenna and a secondary battery, the antenna may be used for contactless power transmission.

The electronic device of this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 16A:
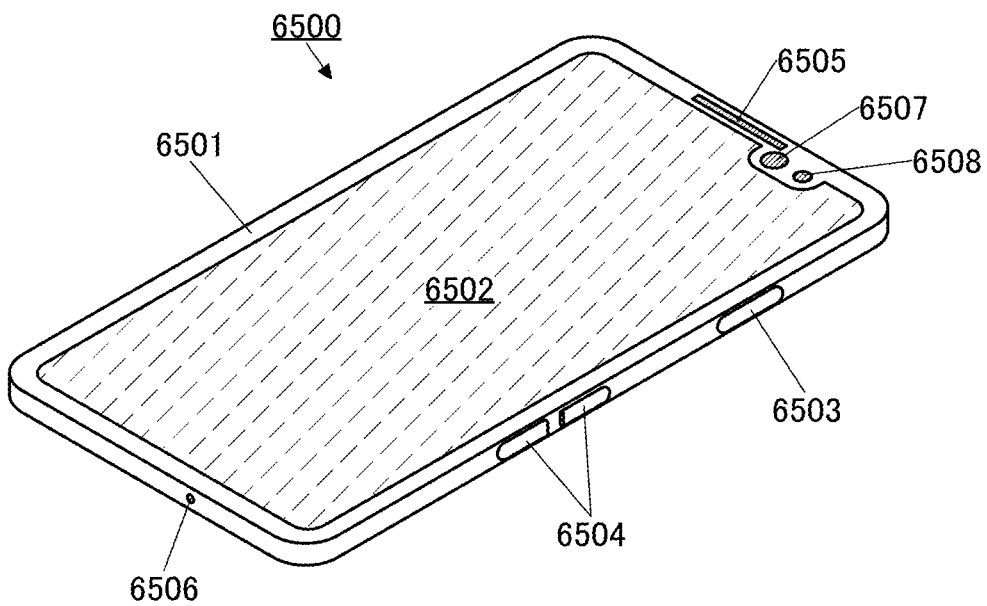
FIG. 16A and FIG. 16B are diagrams illustrating a structure example of an electronic device.

An electronic device 6500 illustrated in FIG. 16A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 16B:
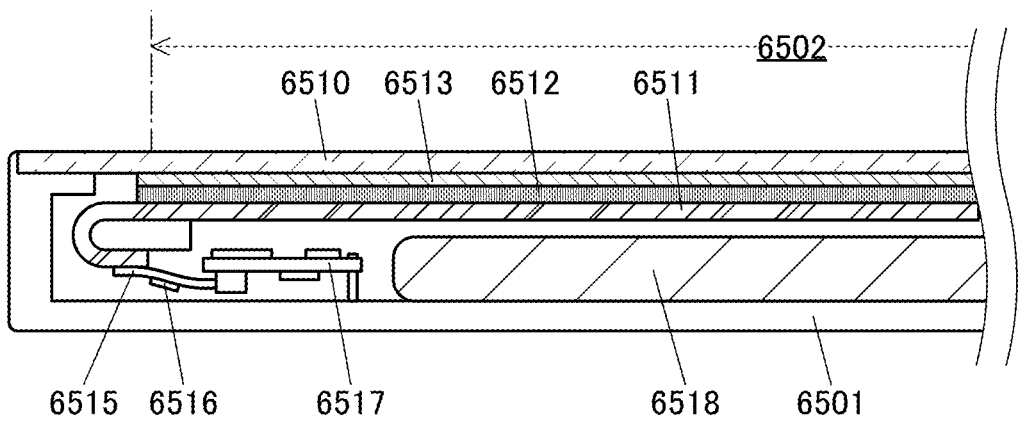

FIG. 16B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. An electronic device with a narrow frame can be achieved when part of the display panel 6511 is folded back so that the portion connected to the FPC 6515 is provided on the rear side of a pixel portion.

Figure 17A:
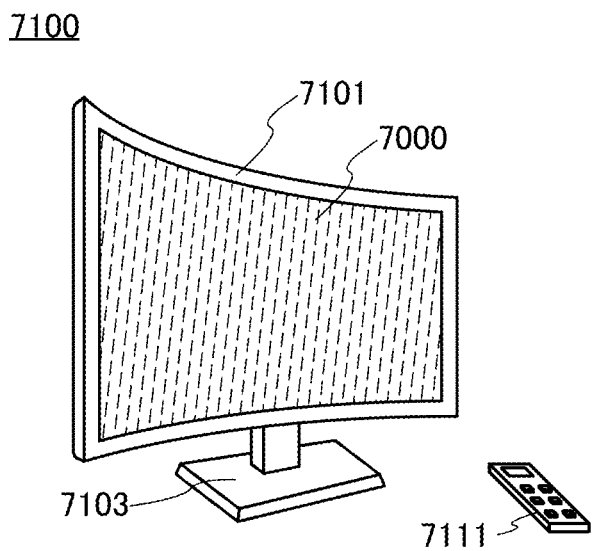
FIG. 17A to FIG. 17D are diagrams illustrating structure examples of electronic devices.

FIG. 17A illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used in the display portion 7000.

Operation of the television device 7100 illustrated in FIG. 17A can be performed with an operation switch provided in the housing 7101 and a separate remote controller 7111. Alternatively, the display portion 7000 may include a touch sensor, and the television device 7100 may be operated by a touch on the display portion 7000 with a finger or the like. The remote controller 7111 may include a display portion for displaying information output from the remote controller 7111. With operation keys or a touch panel provided in the remote controller 7111, channels and volume can be controlled, and videos displayed on the display portion 7000 can be controlled.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 17B:
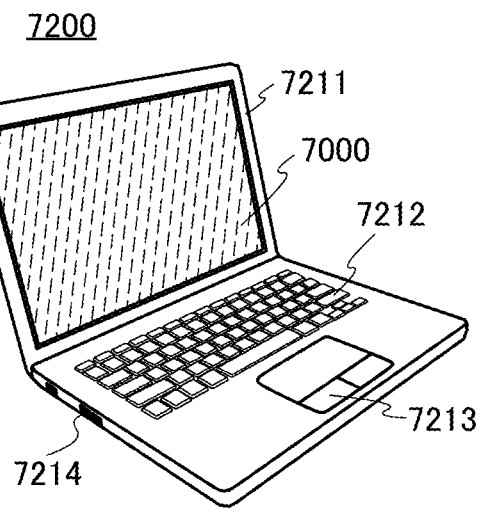

FIG. 17B illustrates an example of a laptop personal computer. A laptop personal computer 7200 includes a housing 7211, a keyboard 7212, a pointing device 7213, an external connection port 7214, and the like. The display portion 7000 is incorporated in the housing 7211.

The display device of one embodiment of the present invention can be used in the display portion 7000.

Figure 17C:
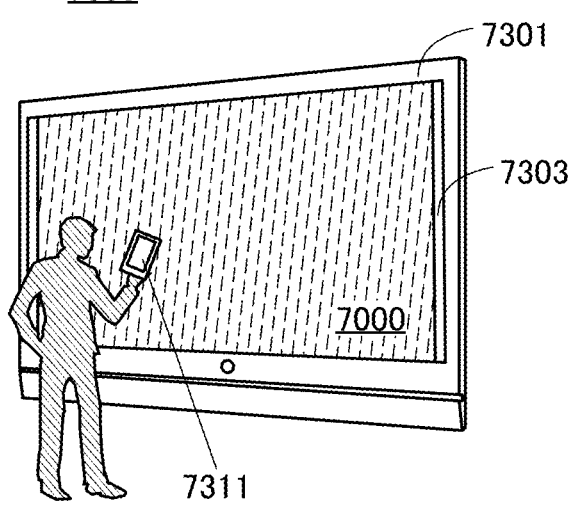
Figure 17D:
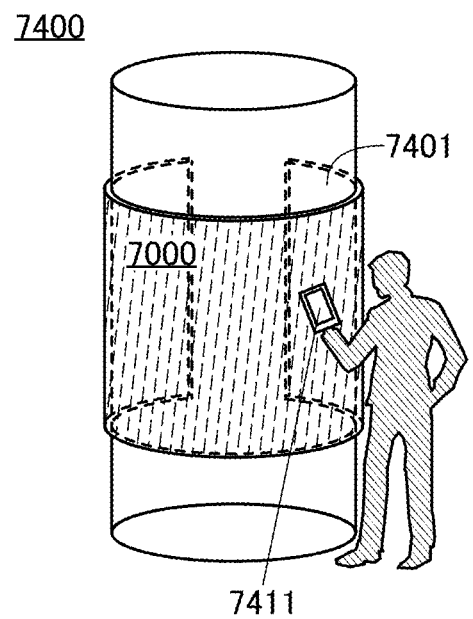

FIGS. 17C and 17D illustrate examples of digital signage.

A digital signage 7300 illustrated in FIG. 17C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 17D illustrates a digital signage 7400 mounted on a cylindrical pillar 7401. The digital signage 7400 includes the display portion 7000 provided along a curved surface of the pillar 7401.

The display device of one embodiment of the present invention can be used in the display portion 7000 in each of FIG. 17C and FIG. 17D.

A larger area of the display portion 7000 can increase the amount of information that can be provided at a time. The larger display portion 7000 attracts more attention, so that the advertising effectiveness can be enhanced, for example.

A touch panel is preferably used in the display portion 7000, in which case intuitive operation by a user is possible in addition to display of an image or a moving image on the display portion 7000. Moreover, for an application for providing information such as route information or traffic information, usability can be enhanced by intuitive operation.

As illustrated in FIG. 17C and FIG. 17D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Figure 18A:
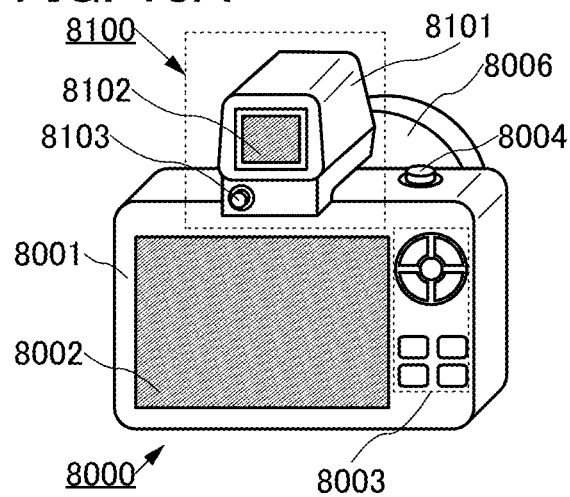
FIG. 18A to FIG. 18F are diagrams illustrating examples of electronic devices.

FIG. 18A is an external view of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000. Note that the lens 8006 and the housing 8001 may be integrated with each other in the camera 8000.

The camera 8000 can take images by the press of the shutter button 8004 or touch on the display portion 8002 serving as a touch panel.

The housing 8001 includes a mount including an electrode, so that, in addition to the finder 8100, a stroboscope or the like can be connected to the housing.

The finder 8100 includes a housing 8101, a display portion 8102, a button 8103, and the like.

The housing 8101 is attached to the camera 8000 with the mount engaging with a mount of the camera 8000. In the finder 8100, a video or the like received from the camera 8000 can be displayed on the display portion 8102.

The button 8103 has a function of a power button or the like.

The display device of one embodiment of the present invention can be used for the display portion 8002 of the camera 8000 and the display portion 8102 of the finder 8100. Note that a finder may be incorporated in the camera 8000.

Figure 18B:
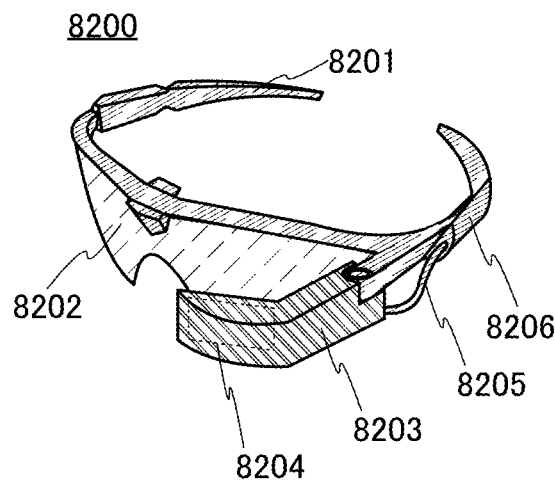

FIG. 18B is an external view of a head-mounted display 8200.

The head-mounted display 8200 includes a mounting portion 8201, a lens 8202, a main body 8203, a display portion 8204, a cable 8205, and the like. In addition, a battery 8206 is incorporated in the mounting portion 8201.

The cable 8205 supplies power from the battery 8206 to the main body 8203. The main body 8203 includes a wireless receiver or the like and can display received video information on the display portion 8204. In addition, the main body 8203 is provided with a camera, and information on the movement of the user's eyeball or eyelid can be used as an input means.

The mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with the use of current flowing through the electrodes. Moreover, the mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, or the like.

The display device of one embodiment of the present invention can be used for the display portion 8204.

Figure 18C:
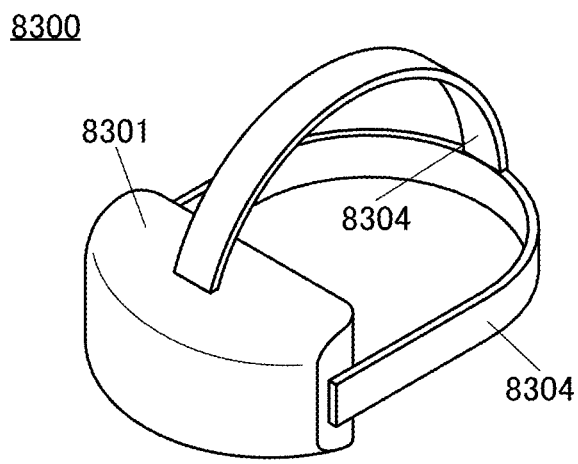
Figure 18D:
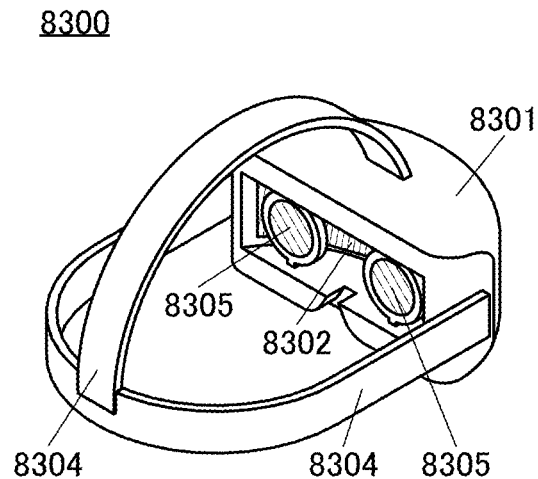
Figure 18E:
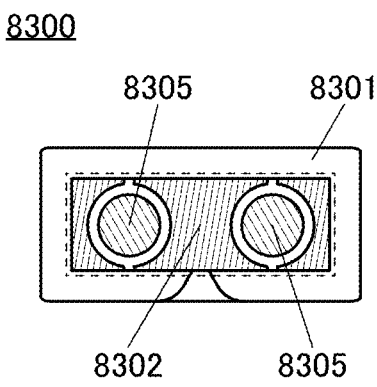

FIG. 18C to FIG. 18E are external views of a head-mounted display 8300. The head-mounted display 8300 includes a housing 8301, a display portion 8302, band-shaped fixing units 8304, and a pair of lenses 8305.

A user can see display on the display portion 8302 through the lenses 8305. Note that the display portion 8302 is preferably placed to be curved, in which case the user can feel a high realistic sensation. In addition, when another image displayed on a different region of the display portion 8302 is viewed through the lenses 8305, three-dimensional display using parallax or the like can also be performed. Note that the structure is not limited to the structure in which one display portion 8302 is provided; two display portions 8302 may be provided and one display portion may be provided per eye of the user.

The display device of one embodiment of the present invention can be used for the display portion 8302. The display device of one embodiment of the present invention achieves extremely high resolution. For example, a pixel is not easily seen by the user even when the user sees display that is magnified by the use of the lenses 8305 as illustrated in FIG. 18E. In other words, a video with a strong sense of reality can be seen by the user with use of the display portion 8302.

Figure 18F:
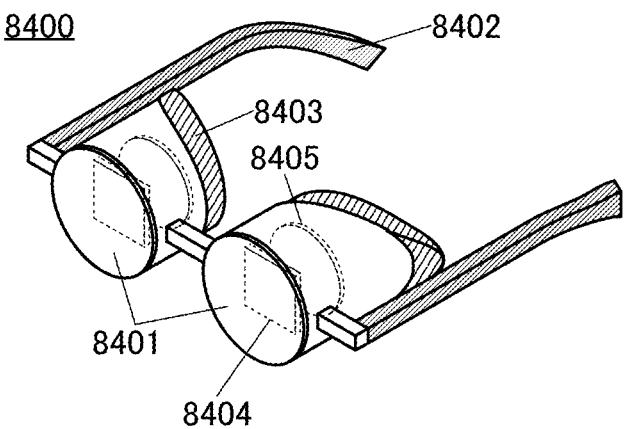

FIG. 18F is an external view of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. Furthermore, when the pair of display portions 8404 display different images, three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has flexibility and elasticity so as to be adjusted to fit the size of the user's face and not to slide down. In addition, part of the mounting portion 8402 preferably has a vibration mechanism functioning as a bone conduction earphone. Thus, audio devices such as an earphone and a speaker are not necessarily provided separately, and the user can enjoy images and sounds only by wearing the head-mounted display 8400. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used.

Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable in order to easily perform cleaning or replacement.

Electronic devices illustrated in FIG. 19A to FIG. 19F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 19A to FIG. 19F have a variety of functions. For example, the electronic device can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The display device of one embodiment of the present invention can be used for the display portion 9001.

The details of the electronic devices illustrated in FIG. 19A to FIG. 19F will be described below.

Figure 19A:
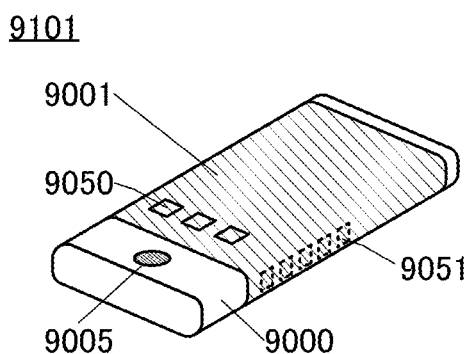
FIG. 19A to FIG. 19F are diagrams illustrating examples of electronic devices.

FIG. 19A is a perspective view illustrating a portable information terminal 9101. The portable information terminal 9101 can be used as a smartphone, for example. Note that the portable information terminal 9101 may be provided with the speaker 9003, the connection terminal 9006, the sensor 9007, or the like. The portable information terminal 9101 can display characters and image information on its plurality of surfaces. FIG. 19A illustrates an example in which three icons 9050 are displayed. Information 9051 indicated by dashed rectangles can be displayed on another surface of the display portion 9001. Examples of the information 9051 include notification of reception of an e-mail, SNS, an incoming call, or the like, the title and sender of an e-mail, SNS, or the like, the date, the time, remaining battery, and the reception strength of an antenna. Alternatively, the icon 9050 or the like may be displayed at the position where the information 9051 is displayed.

Figure 19B:
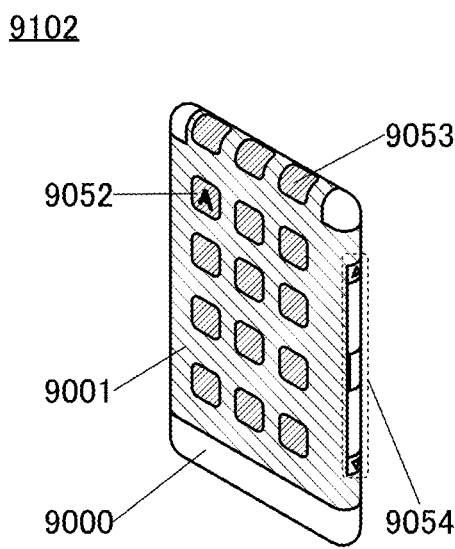

FIG. 19B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can check the information 9053 displayed in a position that can be observed from above the portable information terminal 9102, with the portable information terminal 9102 put in a breast pocket of his/her clothes. The user can seethe display without taking out the portable information terminal 9102 from the pocket and decide whether to answer a call, for example.

Figure 19C:
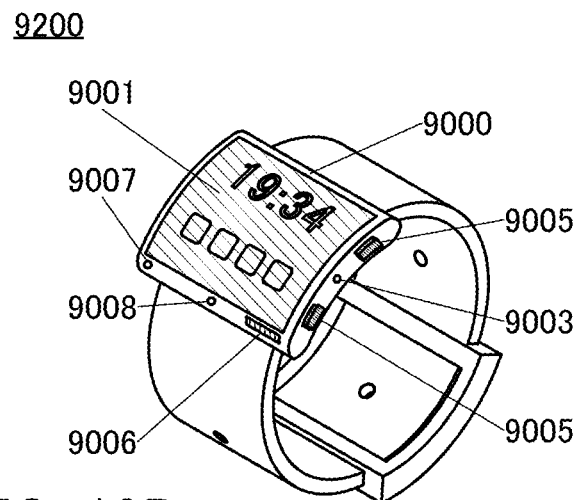

FIG. 19C is a perspective view illustrating a watch-type portable information terminal 9200. The portable information terminal 9200 can be used as a smartwatch (registered trademark), for example. The display portion 9001 is provided such that its display surface is curved, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 19D:
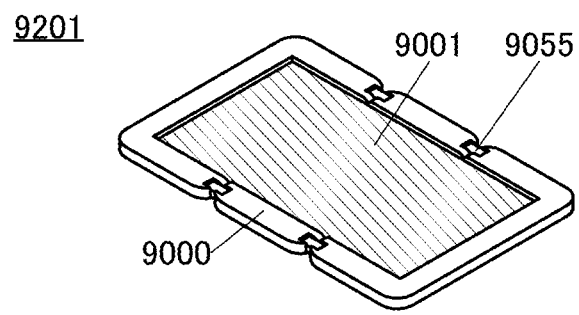
Figure 19E:
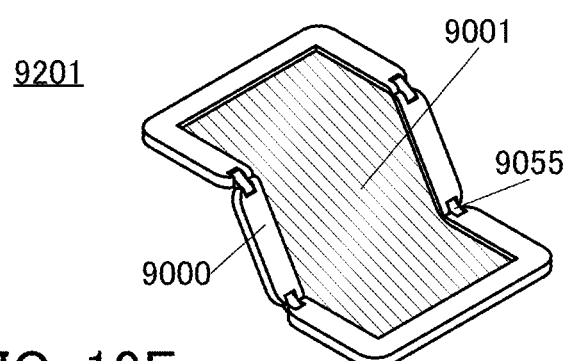
Figure 19F:
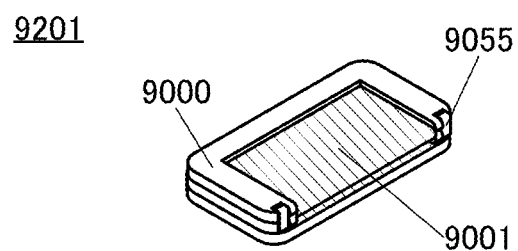

FIG. 19D to FIG. 19F are perspective views showing a foldable portable information terminal 9201. FIG. 19D is a perspective view of an opened state of the portable information terminal 9201, FIG. 19F is a perspective view of a folded state thereof, and FIG. 19E is a perspective view of a state in the middle of change from one of FIG. 19D and FIG. 19F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature greater than or equal to 0.1 mm and less than or equal to 150 mm.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Example 1

This example shows examination results of the influence of a sacrificial layer on a light-emitting element.

In this example, three kinds of samples (Sample A1 to Sample A3) were fabricated.

[Sample A1]

A light-emitting element included in Sample A1 was formed by forming a hole-injection layer, a hole-transport layer, a light-emitting layer, an electron-transport layer, an electron-injection layer, and a common electrode in this order by a vacuum evaporation method over a pixel electrode formed over a glass substrate.

[Sample A2]

For a light-emitting element included in Sample A2, firstly, a hole-injection layer, a hole-transport layer, a light-emitting layer, and an electron-transport layer were formed over a pixel electrode formed over a glass substrate. Next, an aluminum oxide film was formed as a sacrificial layer and a metal oxide film was formed to be stacked as a protective layer. The aluminum oxide film was formed by an ALD method and the metal oxide film was formed by a sputtering method using an In—Ga—Zn oxide as a sputtering target. After that, the metal oxide film was removed by a wet etching method using oxalic acid, and subsequently the aluminum oxide film was removed by a wet etching method using TMAH, so that the electron-transport layer was exposed. Next, an electron-injection layer and a common electrode were formed in this order over the electron-transport layer.

[Sample A3]

For a light-emitting element included in Sample A3, firstly, a hole-injection layer, a hole-transport layer, a light-emitting layer, and an electron-transport layer were formed over a pixel electrode formed over a glass substrate. Next, a metal oxide film was formed as a sacrificial layer by a sputtering method using an In—Ga—Zn oxide as a sputtering target, and subsequently the metal oxide film was removed by a wet etching method using oxalic acid, so that the electron-transport layer was exposed. Then, an electron-injection layer and a common electrode were formed in this order over the electron-transport layer.

Materials, thicknesses, deposition conditions, and the like of the layers were the same in Sample A1 to Sample A3.

[Measurement Results]

Luminance-voltage characteristics of Sample A1 to Sample A3 were evaluated.

Figure 20:
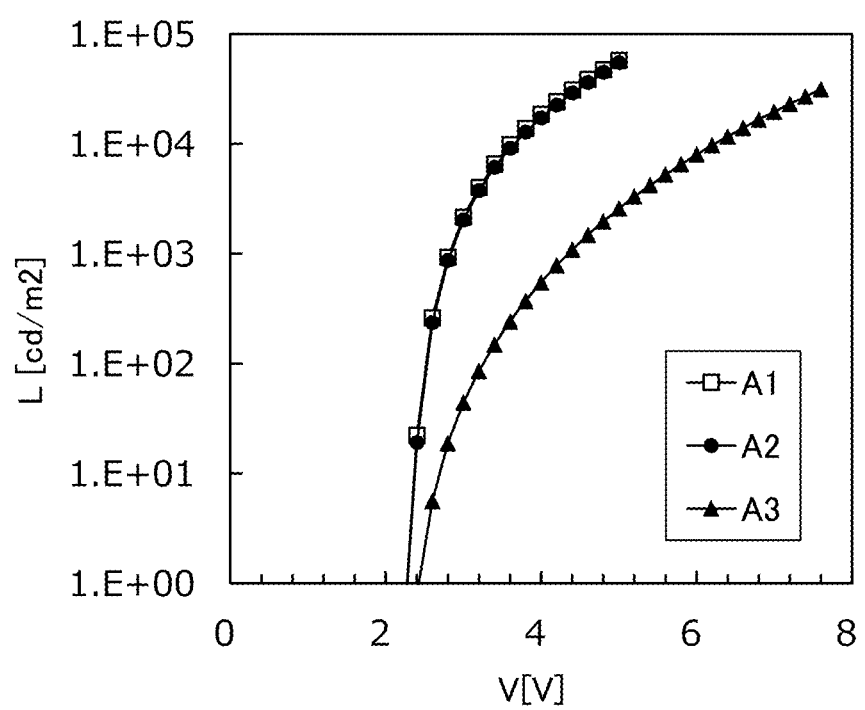
FIG. 20 shows measurement results of Example.

FIG. 20 shows current-voltage characteristics. In FIG. 20, the horizontal axis represents voltage (V[V]) and the vertical axis represents luminance (L[cd/m$^2$]). As shown in FIG. 20, a difference between Sample A1 and Sample A2 was found to be small. It is confirmed that the voltage of Sample A3 is higher than that of the sample A1.

From the above, in the case where a sacrificial layer and a protective layer are stacked, it was found that reduction in deposition damage to an EL layer was possible by forming the sacrificial layer, which is formed directly on the EL layer (the electron-transport layer), by an ALD method even when the protective layer was further formed over the EL layer by a sputtering method.

Example 2

This example shows examination results on the influence of a difference in methods for removing a sacrificial layer on peeling (film lifting).

In this example, two kinds of samples (Sample B1 and Sample B2) were fabricated.

[Sample B1]

For Sample B1, firstly, a hole-injection layer, a hole-transport layer, a light-emitting layer, and an electron-transport layer were formed as an EL layer over a pixel electrode formed over a glass. Next, an aluminum oxide film and a metal oxide film were formed to be stacked as a sacrificial layer and a protective layer, respectively. After that, a resist mask was formed over the metal oxide film by a photolithography method. Subsequently, the metal oxide film was etched by a wet etching method using oxalic acid. Then, the aluminum oxide film and the resist mask were removed by a wet etching method using TMAH.

Due to the film lifting which occurred at this stage, the process of Sample B1 was terminated.

[Sample B2]

For Sample B2, an EL layer, a sacrificial layer, a protective layer, and a resist mask were formed in a manner similar to that for Sample B1. Next, a metal oxide film was etched by a wet etching method using oxalic acid. Subsequently, the resist mask was removed using a resist stripper. Then, a region of the aluminum oxide film that is not covered with the metal oxide film was etched by a dry etching method. As an etching gas for the aluminum oxide film, a mixed gas of CHF$_3$ and He was used. Next, the EL layer was etched by a dry etching method using the metal oxide film as a mask. As an etching gas for the EL layer, a mixed gas of CF$_4$ and He was used.

[Observation Results]

Figure 21A:
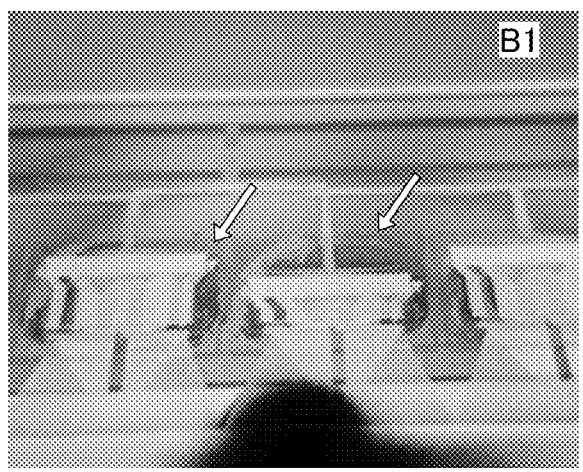
FIG. 21A to FIG. 21C are observation photographs of Example.
Figure 21B:
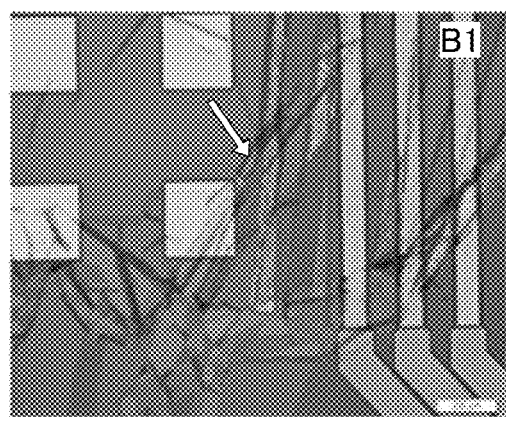
Figure 21C:
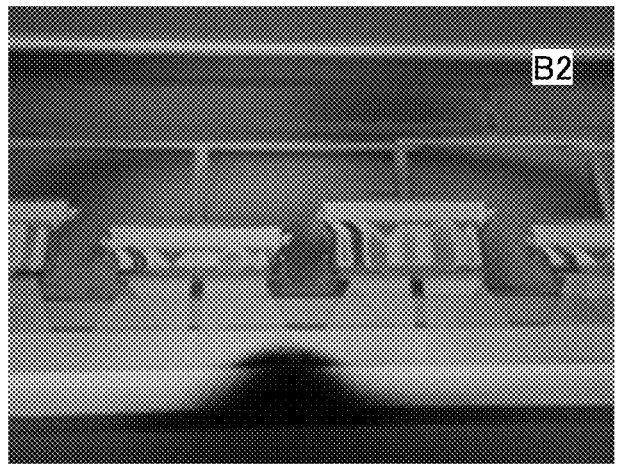

Sample B1 and Sample B2 were observed. FIG. 21A and FIG. 21C show photographs of Sample B1 and Sample B2, respectively.

In Sample B1, film lifting was observed as indicated by arrows in FIG. 21A. FIG. 21B shows an optical micrograph of a portion where the film lifting has occurred. It was confirmed that the film lifting occurred at an interface between the EL layer and the aluminum oxide film.

In contrast, in Sample B2, film lifting was not observed as shown in FIG. 21C.

From the above, it was confirmed that when stacking the sacrificial layer and the protective layer, inhibiting occurrence of the film lifting was possible by removing the resist mask, processing the sacrificial layer by a dry etching method, and the like before the etching of the sacrificial layer in contact with the EL layer.

Example 3

In this example, a display panel of one embodiment of the present invention was fabricated.

[Fabrication of Display Panel]

The fabrication of the display panel was performed based on the method described in Embodiment 1 and Manufacturing method example 1. Specifically, a substrate, that is, a glass substrate over which a pixel circuit including a transistor, a wiring, and the like and a pixel electrode were formed, was prepared. Next, after an EL layer of red, an EL layer of green, and an EL layer of blue were formed in this order, the sacrificial layer and the protective layer over the EL layers were removed. Subsequently, an electron-injection layer, a common electrode, and a protective layer were formed in this order over the EL layers. Then, a glass substrate was attached to the substrate with a sealing resin.

An aluminum oxide film formed by an ALD method was used as the sacrificial layer, and an In—Ga—Zn oxide film formed by a sputtering method was used as the protective layer.

The display portion of the display panel has a diagonal size of 8.33 inches, an effective pixel number of 7680×4320 (corresponding to 8K4K), and resolution of 1058 ppi.

[Results]

FIG. 22A shows a display panel in a display state. A separate coloring method made it possible to achieve displaying a full-color image with an extremely high resolution exceeding 1000 ppi.

FIG. 22B shows an optical micrograph of pixels of the display panel. Each subpixel has a size of 12 μm×16 μm. FIG. 22C, FIG. 22D, and FIG. 22E show optical micrographs in a state where red, green, and blue pixels are made to emit light, respectively. In addition, the aperture ratio of the pixel in a designed value was 10.8%, and the aperture ratio of each of the pixels in the display panel shown in FIG. 22C, FIG. 22D, and FIG. 22E was 12.5%.

Figure 23:
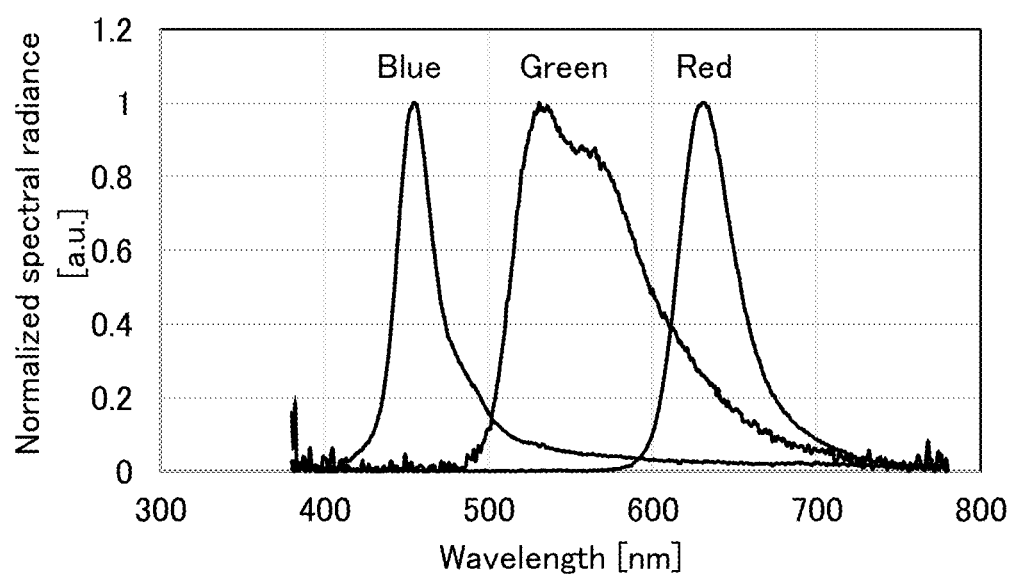
FIG. 23 shows measurement results of spectral radiance of Example.

An emission spectrum of each pixel of the fabricated display panel was evaluated. Here, emission spectra of pixels of red, blue, and green were measured by a spectroradiometer in a state where the pixels emitted lights. FIG. 23 shows wavelength ([nm]) dependence of normalized spectral radiance ([a.u.]). In FIG. 23, emission spectra of pixels of blue, green, and red are shown respectively from the left.

As shown in FIG. 23, for example, the emission spectrum at the time when the red pixel emitted light does not include emission components of green and blue. Similarly, the emission spectra at each time when the green and blue pixels emitted lights do not include emission components of other colors. From the results, it was possible to confirm that current flowed through two adjacent EL layers, and occurrence of unintentional light emission was inhibited.

REFERENCE NUMERALS

100: display device, 101: substrate, 110: light-emitting element, 111: pixel electrode, 111C: connection electrode, 112: EL layer, 113: common electrode, 114: EL layer, 115: optical adjustment layer, 121: protective layer, 122: gap, 130: connection portion, 131: insulating layer, 143: resist mask, 144: sacrificial film, 145: sacrificial layer, 146: protective film, 147: protective layer

The invention claimed is:

1. A display device comprising a first light-emitting element and a second light-emitting element,
    wherein the first light-emitting element comprises a first pixel electrode, a first EL layer, and a common electrode,
    wherein the second light-emitting element comprises a second pixel electrode, a second EL layer, and the common electrode,
    wherein an insulating layer is included between the first pixel electrode and the second pixel electrode,
    wherein the insulating layer comprises a first region overlapping with the first EL layer, a second region overlapping with the second EL layer, and a third region positioned between the first region and the second region and overlapping with neither the first EL layer nor the second EL layer,
    wherein a side surface of the first EL layer and a side surface of the second EL layer are positioned over the insulating layer and are provided to face each other,
    wherein the common electrode is provided along the side surface of the first EL layer, the side surface of the second EL layer, and a top surface of the insulating layer, and
    wherein a width of the insulating layer is greater than or equal to 2 times and less than or equal to 4 times a distance between the first pixel electrode and the second pixel electrode.

2. The display device according to claim 1, wherein the insulating layer comprises an organic resin.

3. The display device according to claim 1,
    wherein, a width of the first region of the insulating layer is larger than a width of the third region and is less than or equal to 3 μm, and
    wherein, a width of the second region of the insulating layer is larger than the width of the third region and is less than or equal to 3 μm.

4. The display device according to claim 1,
    wherein, in the insulating layer, the sum of the width of the first region and the width of the second region is larger than 2 times the width of the third region, and
    wherein the sum of the width of the first region, the width of the second region, and the width of the third region is less than or equal to 6 μm.

5. The display device according to claim 1, wherein the width of the third region is greater than or equal to 1 μm and less than or equal to 2 μm.

6. The display device according to claim 1, wherein an effective light-emitting area ratio is greater than or equal to 70% and less than 100%.

7. A display device comprising a first light-emitting element and a second light-emitting element,
- wherein the first light-emitting element comprises a first pixel electrode, a first EL layer, and a common electrode,
- wherein the second light-emitting element comprises a second pixel electrode, a second EL layer, and the common electrode,
- wherein an insulating layer is included between the first pixel electrode and the second pixel electrode,
- wherein the insulating layer comprises a first region overlapping with the first EL layer, a second region overlapping with the second EL layer, and a third region positioned between the first region and the second region and overlapping with neither the first EL layer nor the second EL layer,
- wherein a side surface of the first EL layer and a side surface of the second EL layer are positioned over the insulating layer and are provided to face each other,
- wherein the common electrode is provided along the side surface of the first EL layer, the side surface of the second EL layer, and a top surface of the insulating layer, and
- wherein a width of the insulating layer is greater than or equal to 2 times and less than or equal to 4 times a distance between the side surface of the first EL layer and the side surface of the second EL layer.

8. The display device according to claim 7, wherein the insulating layer comprises an organic resin.

9. The display device according to claim 7,
- wherein, a width of the first region of the insulating layer is larger than a width of the third region and is less than or equal to 3 µm, and
- wherein, a width of the second region of the insulating layer is larger than the width of the third region and is less than or equal to 3 µm.

10. The display device according to claim 7,
- wherein, in the insulating layer, the sum of the width of the first region and the width of the second region is larger than 2 times the width of the third region, and
- wherein the sum of the width of the first region, the width of the second region, and the width of the third region is less than or equal to 6 µm.

11. The display device according to claim 7, wherein the width of the third region is greater than or equal to 1 µm and less than or equal to 2 µm.

12. The display device according to claim 7, wherein an effective light-emitting area ratio is greater than or equal to 70% and less than 100%.

* * * * *